United States Patent
Kwak et al.

(10) Patent No.: US 11,963,312 B2
(45) Date of Patent: Apr. 16, 2024

(54) ELECTRONIC DEVICE INCLUDING ELECTRONIC COMPONENT

(71) Applicant: Samsung Electronics Co., Ltd., Suwon-si (KR)

(72) Inventors: Myunghoon Kwak, Suwon-si (KR); Kwangtai Kim, Suwon-si (KR); Donghyun Yeom, Suwon-si (KR); Wonho Lee, Suwon-si (KR); Joongyeon Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 279 days.

(21) Appl. No.: 17/450,774

(22) Filed: Oct. 13, 2021

(65) Prior Publication Data
US 2022/0124913 A1   Apr. 21, 2022

Related U.S. Application Data

(63) Continuation of application No. PCT/KR2021/013987, filed on Oct. 12, 2021.

(30) Foreign Application Priority Data

Oct. 20, 2020  (KR) .................. 10-2020-0135684

(51) Int. Cl.
*H05K 5/00* (2006.01)
*H01R 35/02* (2006.01)
*H05K 5/02* (2006.01)

(52) U.S. Cl.
CPC ........... *H05K 5/0017* (2013.01); *H01R 35/02* (2013.01); *H05K 5/0217* (2013.01)

(58) Field of Classification Search
CPC ..... H05K 5/0017; H05K 5/0217; H01R 35/02
(Continued)

(56) References Cited

U.S. PATENT DOCUMENTS

2012/0327327 A1* 12/2012 Joo .................. G06F 1/1637
 361/679.01
2013/0265800 A1* 10/2013 Hong ................ H04M 1/22
 361/752

(Continued)

FOREIGN PATENT DOCUMENTS

CN  105096752  11/2015
EP    3709609   9/2020
(Continued)

OTHER PUBLICATIONS

Search Report and Written Opinion dated Jan. 12, 2022 in counterpart International Patent Application No. PCT/KR2021/013987.
(Continued)

*Primary Examiner* — Andargie M Aychillhum
(74) *Attorney, Agent, or Firm* — Nixon & Vanderhye, P.C.

(57) ABSTRACT

According to various embodiments, an electronic device may include: a housing including a first space; a slide structure including a first surface directed in a first direction and a second surface directed in a second direction opposite the first direction, and slidably combined with the housing; a bendable member connected to the slide structure, and at least partly accommodated in the first space in a slide-in state and forming a same plane as the slide structure in a slide-out state; a flexible display supported by the bendable member and the slide structure; a first substrate disposed in the first space; at least one electronic component disposed in a second space between the first surface of the slide structure and the flexible display; and at least one electrical connection member electrically connecting the flexible display to the first substrate.

19 Claims, 23 Drawing Sheets

(58) Field of Classification Search
USPC .......................................................... 361/749
See application file for complete search history.

(56) References Cited

U.S. PATENT DOCUMENTS

| | | | |
|---|---|---|---|
| 2018/0017999 | A1 | 1/2018 | Kim et al. |
| 2019/0268455 | A1 | 8/2019 | Baek et al. |
| 2020/0329572 | A1* | 10/2020 | Wittenberg .......... H05K 5/0017 |
| 2020/0371558 | A1 | 11/2020 | Kim et al. |
| 2021/0135492 | A1 | 5/2021 | Kim et al. |
| 2021/0219437 | A1 | 7/2021 | Kim et al. |

FOREIGN PATENT DOCUMENTS

| | | |
|---|---|---|
| KR | 10-2018-0008945 | 1/2018 |
| KR | 10-2019-0086305 | 7/2019 |
| KR | 10-2019-0115888 | 10/2019 |
| KR | 10-2019-0143029 | 12/2019 |

OTHER PUBLICATIONS

Extended European Search Report dated Nov. 30, 2023 issued in European Patent Application No. 21883086.7.

* cited by examiner

ELECTRONIC DEVICE INCLUDING ELECTRONIC COMPONENT

CROSS-REFERENCE TO RELATED APPLICATIONS

This application is a continuation of International Application No. PCT/KR2021/013987 designating the United States, filed on Oct. 12, 2021, in the Korean Intellectual Property Receiving Office and claiming priority to Korean Patent Application No. 10-2020-0135684, filed on Oct. 20, 2020, in the Korean Intellectual Property Office, the disclosures of which are incorporated by reference herein in their entireties.

BACKGROUND

Field

The disclosure relates to an electronic device including electronic component.

Description of Related Art

An electronic device has gradually become slimmer, and has been improved so as to increase stiffness, so as to reinforce the design aspect, and so as to differentiate functional elements thereof at the same time. The electronic device has been deviated from the uniform rectangular shape, and has been gradually changed to various shapes. The electronic device may have a transformable structure which is convenient to carry and which can use a large-screen display. For example, as part of the transformable structure, the electronic device may have a structure (e.g., rollable structure or slidable structure) which can extend a display area through a housing combination structure operating in a sliding manner and a flexible display supported by the housing combination structure. There may be a need for an efficient arrangement of electronic components being disposed in an inner space of the electronic device.

An electronic device, when used, may include a slidable electronic device (e.g., rollable electronic device) that can be transformed to expand the display area thereof. The slidable electronic device may include a housing (e.g., base bracket) and a slide structure (e.g., slide bracket or slide housing) which can be movably combined with each other in a manner that they are at least partly fitted together. For example, the slide structure may change the display area of the flexible display through its slide-in or slide-out operation against the housing in a designated direction and in a designated reciprocating distance. For example, the slide structure may support at least a part of the flexible display (or expandable display), may be combined with the housing so as to slide at least partly against the housing, and may induce to change the display area by manually sliding in or out by a user or by being automatically transitioned to a slide-in state or a slide-out state through an internal driving mechanism.

The slidable electronic device may include a plurality of electronic components. Since such electronic components are mainly disposed in the housing, layout designs may be constrained, and the performance of the electronic components may be degraded depending on the slide-in/slide-out operation of the slide structure. For example, in case that an antenna module, as an electronic component, is disposed near the slide structure in the housing, the radiation performance of the antenna module may deteriorate depending on the slide-in/slide-out operation of the slide structure.

SUMMARY

Embodiments of the disclosure provide an electronic device including electronic component.

According to various embodiments, it is possible to provide an electronic device including electronic component that can help an efficient arrangement of the electronic component by disposing the electronic component in the slide structure.

According to various embodiments, it is possible to provide an electronic device including electronic component being configured to be able to manifest an excellent performance regardless of the slide-in/slide-out operation of the slide structure.

According to various example embodiments, an electronic device may include: a housing including a first space; a slide structure including a first surface directed in a first direction and a second surface directed in a second direction opposite the first direction, and configured to be slidably combined with the housing; a bendable member connected to the slide structure, and being at least partly accommodated in the first space in a slide-in state and forming a same plane as the slide structure in a slide-out state; a flexible display supported by the bendable member and the slide structure; a first substrate disposed in the first space; at least one electronic component disposed in a second space between the first surface of the slide structure and the flexible display; and at least one electrical connection member connecting the flexible display to the first substrate.

According various example embodiments of the disclosure, since the at least one electronic component is disposed in the slide structure, it is advantageous for the layout design of the electronic component, and excellent performance is manifested regardless of the slide-in/slide-out operation of the slide structure, and can contribute to the reliability improvement of the electronic device. Further, since the flexible display and the at least one electronic component are connected together with the substrate of the housing through the one electrical connection member (e.g., FPCB), it can help an efficient usage of a component mounting space.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
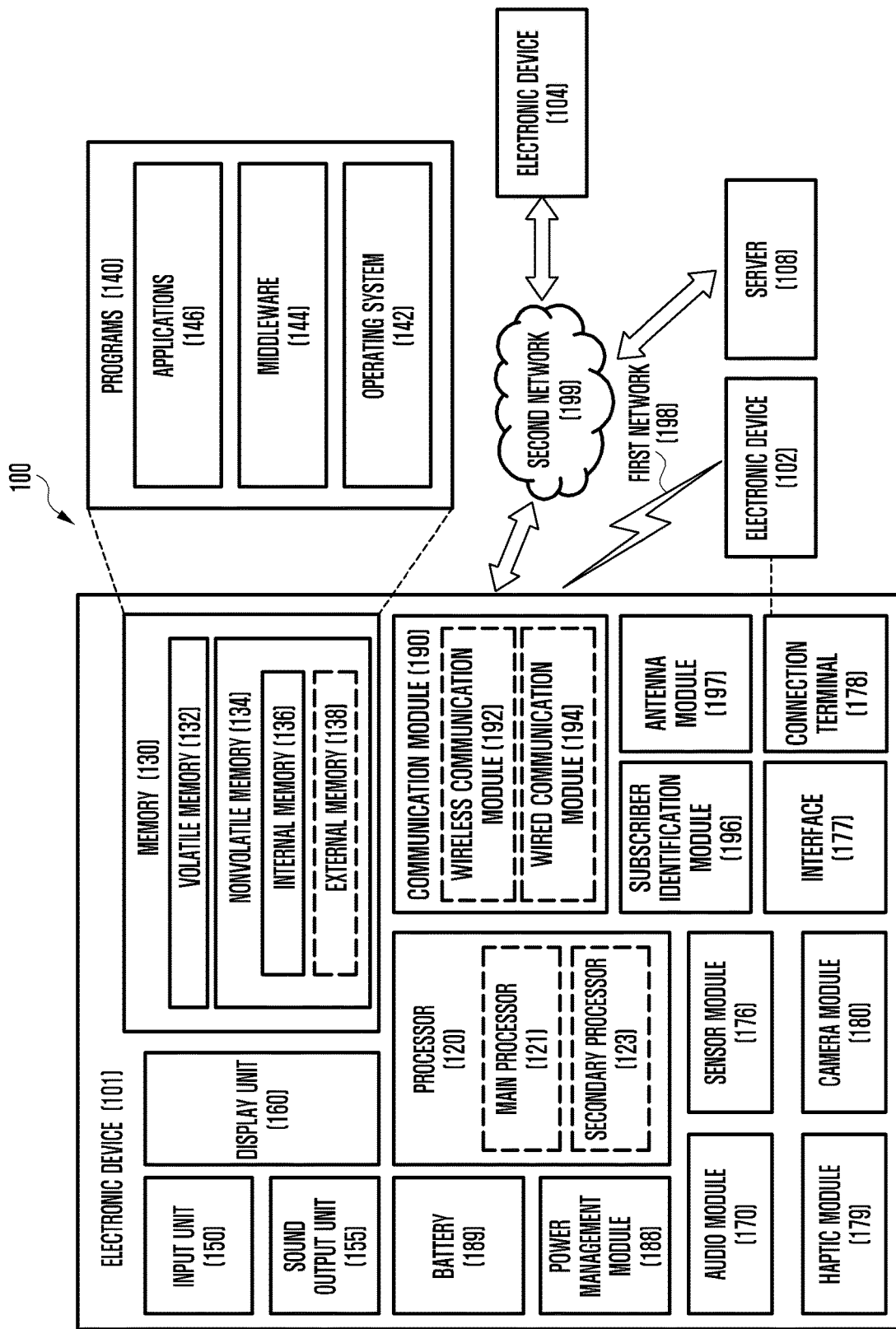
FIG. 1 is a block diagram illustrating an example electronic device in a network environment according to various embodiments.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
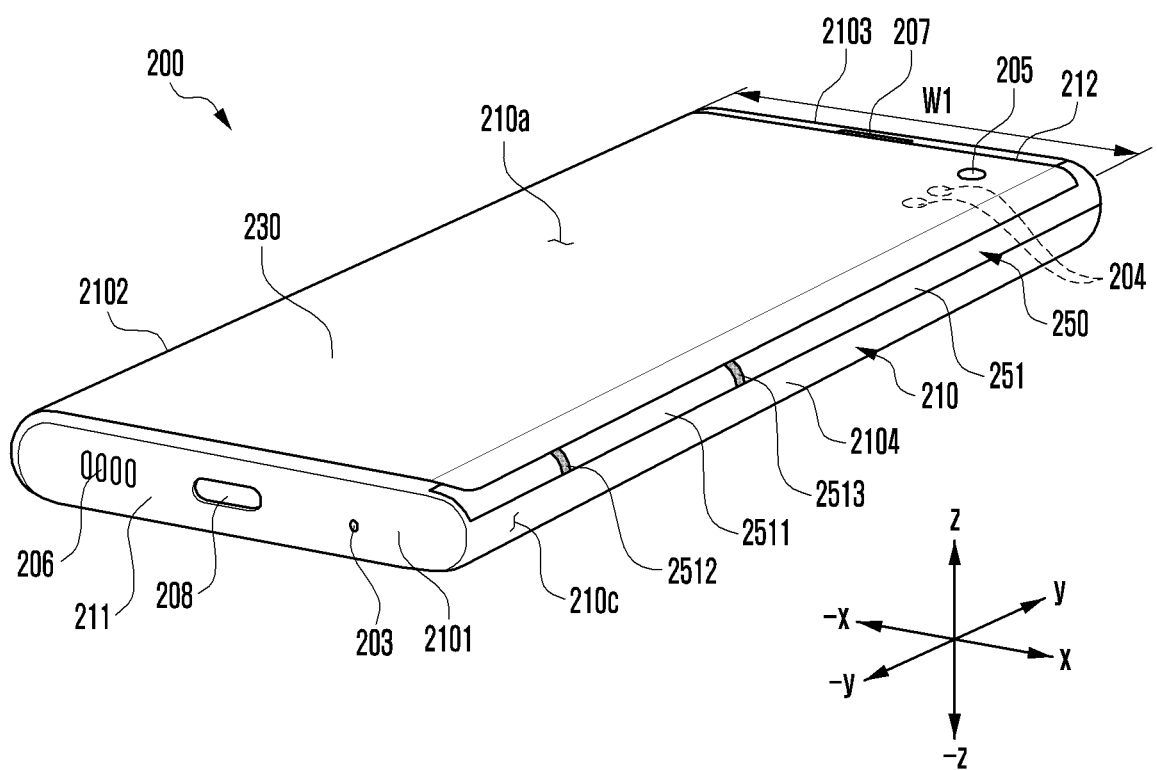
FIGS. 2A and 2B are front perspective views of an electronic device illustrating a slide-in state and a slide-out state, respectively, according to various embodiments.
Figure 2B:
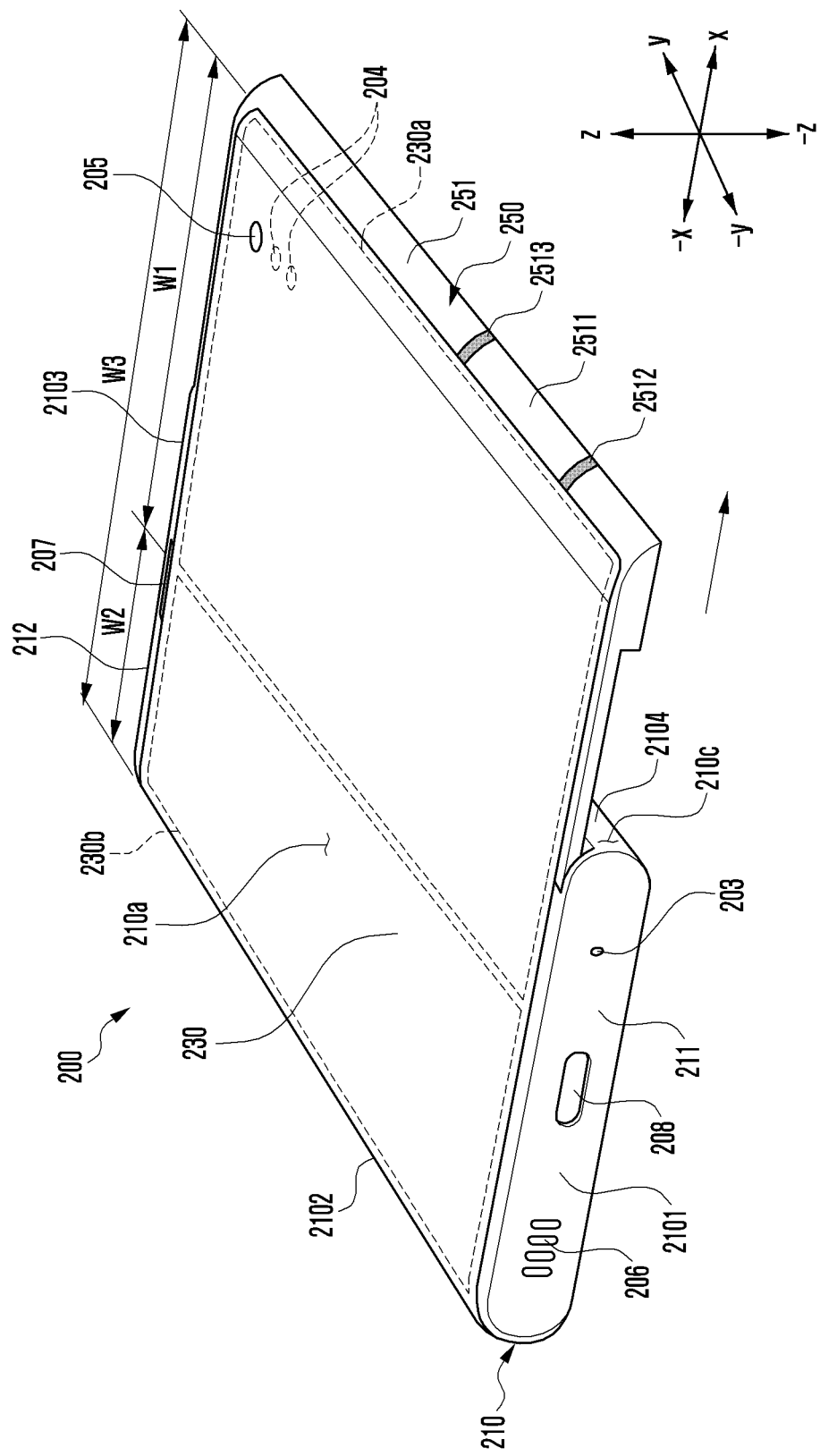
Figure 3A:
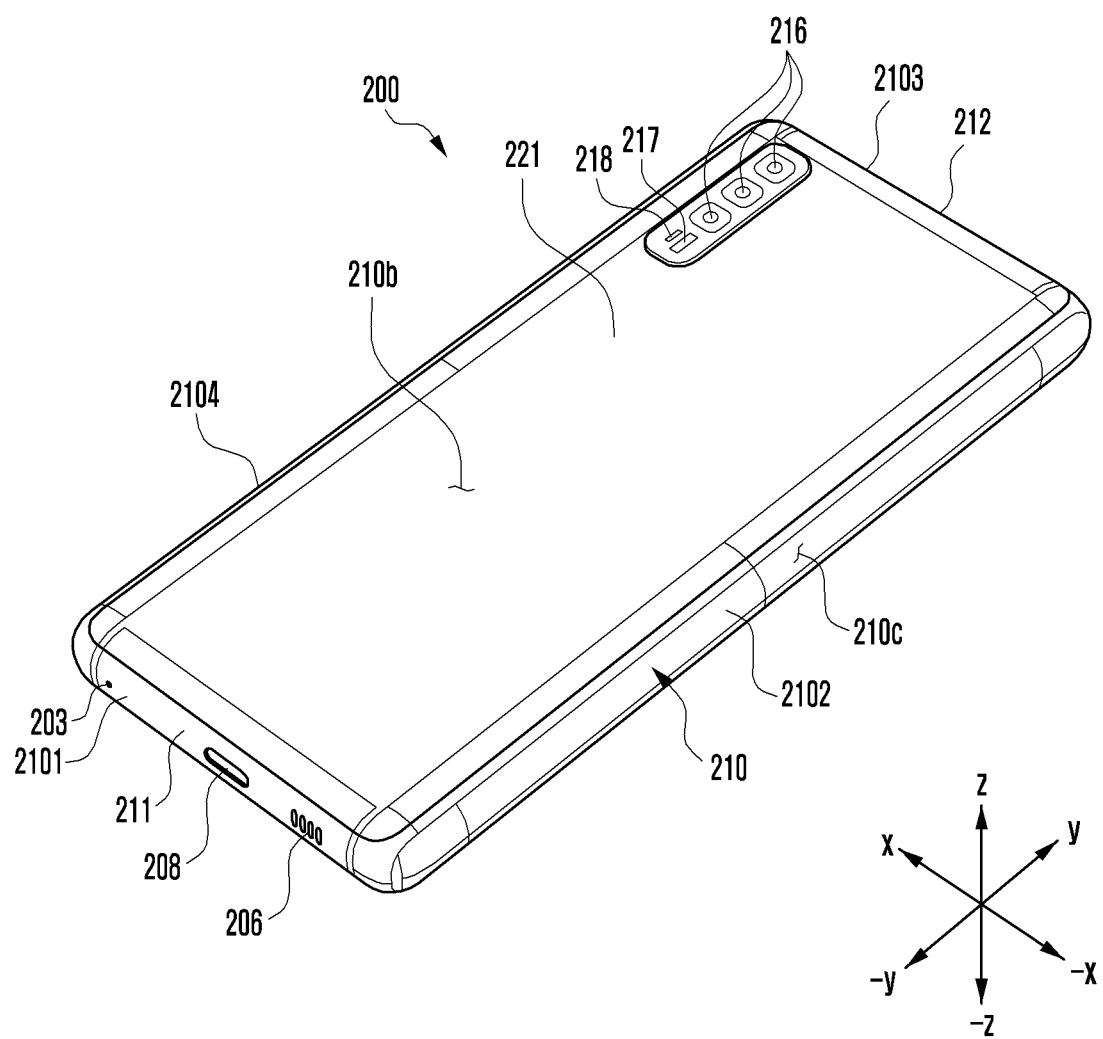
FIGS. 3A and 3B are rear perspective views of an electronic device illustrating a slide-in state and a slide-out state, respectively, according to various embodiments.
Figure 3B:
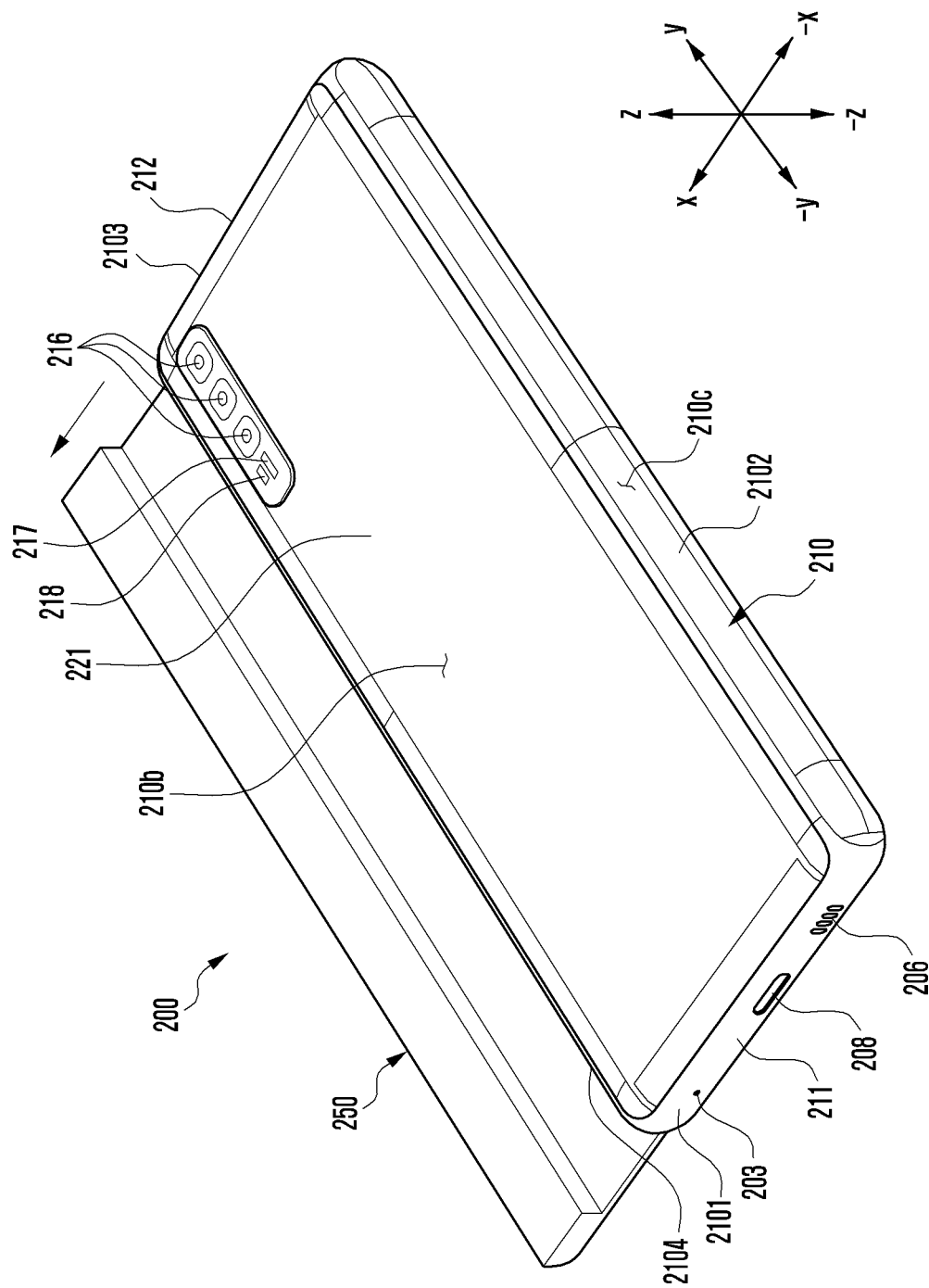

FIGS. 2A and 2B are front perspective views of an electronic device illustrating a slide-in state and a slide-out state, respectively, according to various embodiments. FIGS. 3A and 3B are rear perspective views of an electronic device illustrating a slide-in state and a slide-out state, respectively, according to various embodiments.

Figure 4:
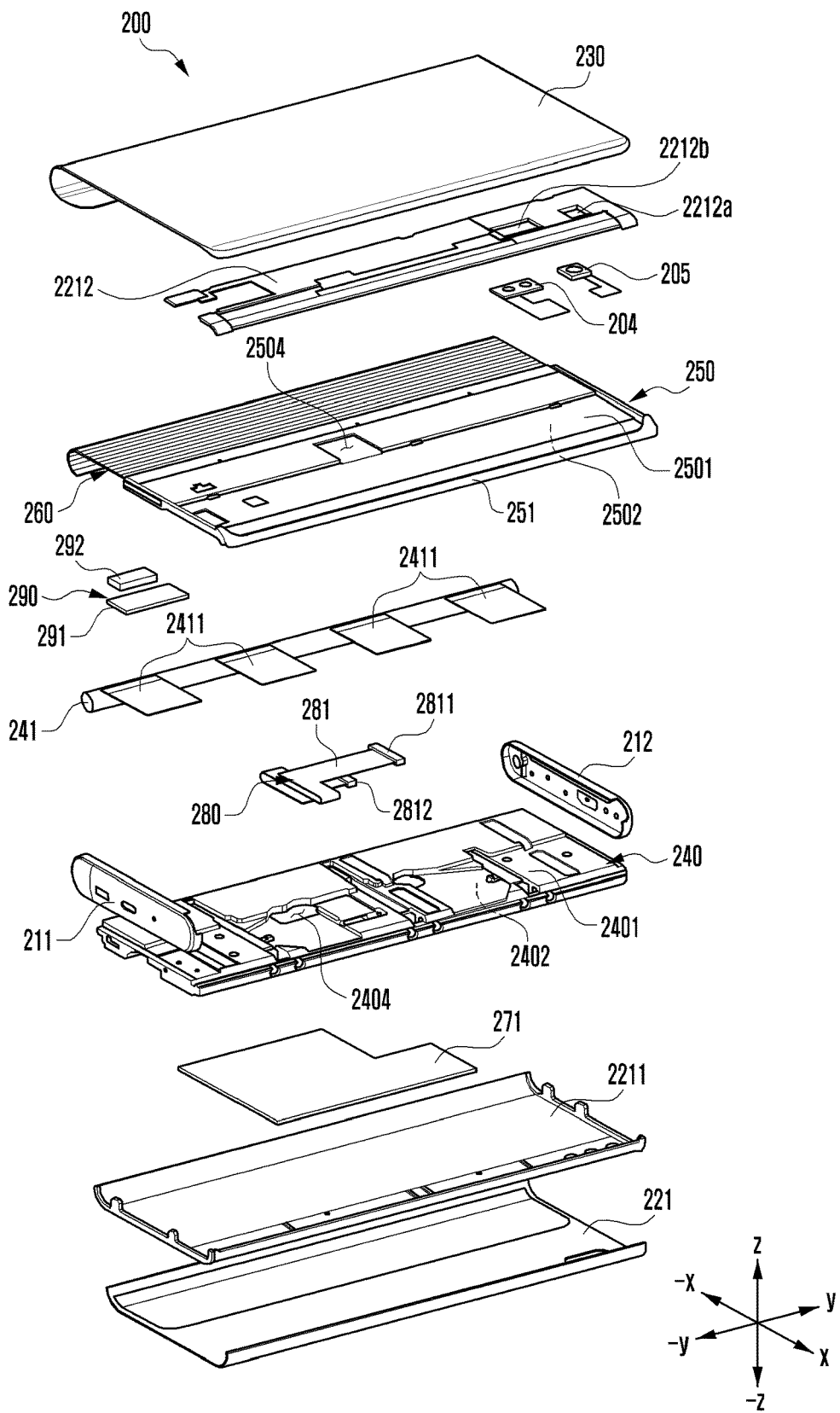
FIG. 4 is an exploded perspective view of an electronic device according to various embodiments.

Referring to FIGS. 2A, 2B, 3A and 3B, an electronic device 200 may include a housing 210 (e.g., housing structure or first housing), a slide structure 250 (e.g., slide member or second housing) movably combined with the housing 210 in a designated direction (e.g., X-axis direction) and in a designated reciprocating distance, a bendable member (or bendable support member) (e.g., bendable member 260 of FIG. 4) (e.g., hinge rail, bendable support or articulated hinge module) connected to one end of the slide structure 250 and being at least partly accommodated in an inner space of the housing 210 through bending in a slide-in state, and a flexible display 230 (e.g., expandable display) disposed to be supported by the slide structure 250 and the bendable member (e.g., bendable member 260 of FIG. 4). According to an embodiment, at least a part of the flexible display 230 may be disposed so as not to be seen from an outside by being accommodated in the inner space of the housing 210 while being supported by the bendable member (e.g., bendable member 260 of FIG. 4) in a slide-in state. According to an embodiment, the at least a part of the flexible display 230 may be disposed to be seen from the outside while being supported by the bendable member (e.g., bendable member 260 of FIG. 4) that forms the same plane as the slide structure 260 in a slide-out state.

According to various embodiments, the electronic device 200 may include the housing 210 (e.g., housing structure) including a front surface 210a (e.g., first surface) directed in a first direction (e.g., Z-axis direction), a rear surface 210b (e.g., second surface) directed in a second direction (e.g., −Z-axis direction) that is opposite to the first direction, and a side surface 210c surrounding a space between the front surface 210a and the rear surface 210b and being at least partly exposed to an outside. According to an embodiment, the rear surface 210b may include a rear cover 221 configured as at least a part of the housing 210. In an embodiment, the housing 210 may be configured through a base bracket (e.g., base bracket 240 of FIG. 4) disposed in an inner space of the electronic device and guiding the slide structure 250, at least one side cover (e.g., side covers 211 and 212 of FIG. 4) combined with at least a part of the base bracket (e.g., base bracket 240 of FIG. 4), and at least a part of the rear cover 221. According to an embodiment, the rear cover 221 may be formed of polymer, coated or colored glass, ceramic, metal (e.g., aluminum, stainless steel (STS), or magnesium), or combinations of at least two of the above materials. In an embodiment, the rear cover 221 may extend up to at least a part of the side surface 210c.

According to various embodiments, the side surface 210c may include a first side surface 2101 having a first length, a second side surface 2102 extending from the first side surface 2101 in a vertical direction so as to have a second length that is longer than the first length, a third side surface 2103 extending from the second side surface 2102 in parallel to the first side surface 2101 and having the first length, and a fourth side surface 2104 extending from the third side surface 2103 in parallel to the second side surface 2102 and having the second length. According to an embodiment, the slide structure 250 may support the flexible display 230, and may slide out from the second side surface 2102 in a direction of the fourth side surface 2104 (e.g., X-axis direction) to expand the display area of the flexible display 230, or may slide in from the fourth side surface 2104 in a direction of the second side surface 2102 (e.g., −X-axis direction) to reduce the display area of the flexible display 230. According to an embodiment, the at least one side cover 211 and 212 may be disposed on the first side surface 2101 and the third side surface 2103.

According to various embodiments, the electronic device 200 may include the flexible display 230 being disposed to be supported by the slide structure 250. According to an embodiment, the flexible display 230 may include a first area 230a (e.g., plane part) being supported by the slide structure 250, and a second area 230b (e.g., bendable part) extending from the first area 230a and being supported by a bendable member (e.g., bendable member 260 of FIG. 4). According to an embodiment, a second area 230b of the flexible display 230 may slide into an inner space of the housing 210 and may be disposed so as not to be exposed to the outside in a slide-in state of the electronic device 200, and may be exposed to the outside so as to extend from the first area 230a while being supported by the bendable member (e.g., bendable member 260 of FIG. 4) in a slide-out state of the electronic device 200. Accordingly, the electronic device 200 may include a rollable type and/or slidable type electronic device in which the display area of the flexible display 230 is changed in accordance with the movement of the slide structure 250 from the housing 210.

According to various embodiments, the slide structure 250 may be slidably combined with the housing 210 so as to at least partly slide in or out from the housing 210. For example, the electronic device 200, in the slide-in state, may be configured to have a first width W1 from the second side surface 2102 to the fourth side surface 2104. According to an embodiment, the electronic device 200, in the slide-out state, may operate to have a third width W3 that is larger than the first width W1 since the bendable member (e.g., bendable member 260 of FIG. 4) having slid into the inside of the housing 210 moves in the direction (e.g., X-axis direction) designated to have an additional second width W2. Accordingly, the flexible display 230 may substantially have the display area of the first width W1 in the slide-in state, and may substantially have the expanded display area of the third width W3 in the slide-out state.

According to various embodiments, the slide structure 250 may operate through a user's operation. For example, the electronic device 200 may be transitioned to the slide-in state or the slide-out state through the user's operation of pressing an outer surface of the flexible display 230 in a designated direction. In an embodiment, in the electronic device 200, the slide structure 250 may slide out in the designated direction (e.g., X-axis direction) through an operation of a button (not illustrated) of a locker (not illustrated) exposed to the outside. In this case, when being pressed in a designated direction (e.g., −X-axis direction), the slide structure 250 may maintain the slide-in state through the locker (not illustrated) while reserving an elastic force for the slide-out by an elastic member. In an embodiment, the slide structure 250 may automatically operate through a driving mechanism (e.g., driving motor, deceleration module, and/or gear assembly) disposed in the inner space of the housing 210. According to an embodiment, through a processor (e.g., processor 120 of FIG. 1), the electronic device 200 may be configured to control the operation of the slide structure 250 through the driving mechanism when detecting an event for the transition to the slide-in/slide-out state of the electronic device 200. In an embodiment, the processor (e.g., processor 120 of FIG. 1) of the electronic device 200 may control the flexible display 230 to display objects in various ways and to execute an application program in correspondence to the changed display area of the flexible display 230 depending on the slide-in state, the slide-out state, or an intermediate state.

According to various embodiments, the electronic device 200 may include at least one of an input device 203, sound output devices 206 and 207, sensor modules 204 and 217, camera modules 205 and 216, a connector port 208, a key input device (not illustrated), or an indicator (not illustrated). As an embodiment, the electronic device 200 may be configured to omit at least one of the above-described elements or to additionally include other elements.

According to various embodiments, the input device 203 may include a microphone. In an embodiment, the input device 203 may include a plurality of microphones disposed to detect the direction of sound. The sound output devices 206 and 207 may include speakers. The sound output devices 206 and 207 may include an external speaker 206 and a call receiver 207. As an embodiment, the sound output devices 206 and 207 may include a speaker (e.g., piezoelectric speaker) that operates in a state where a separate speaker hall is excluded.

According to various embodiments, the sensor modules 204 and 217 may generate an electric signal or a data value corresponding to an internal operation state of the electronic device 200 or an external environment state. For example, the sensor modules 204 and 217 may include a first sensor module 204 (e.g., proximity sensor or illuminance sensor) disposed on the front surface 210a of the electronic device 200 and/or a second sensor module 217 (e.g., heart rate monitoring (HRM) sensor) disposed on the rear surface 210b of the electronic device 200. According to an embodiment, the first sensor module 204 may be disposed under the flexible display 230 on the front surface 210a of the electronic device 200. According to an embodiment, the first sensor module 204 may include at least one of a proximity sensor, an illuminance sensor, a time of flight (TOF) sensor, an ultrasonic sensor, a fingerprint recognition sensor, a gesture sensor, a gyro sensor, a barometric pressure sensor, a magnetic sensor, an acceleration sensor, a grip sensor, a color sensor, an infrared (IR) sensor, a biosensor, a temperature sensor, or a humidity sensor.

According to various embodiments, the camera modules 205 and 216 may include a first camera module 205 disposed on the front surface 210a of the electronic device 200 and a second camera module 216 disposed on the rear surface 210b of the electronic device 200. According to an embodiment, the electronic device 200 may include a flash 218 located near the second camera module 216. According to an embodiment, the camera modules 205 and 216 may include one or a plurality of lenses, an image sensor, and/or an image signal processor. According to an embodiment, the first camera module 205 may be disposed under the flexible display 230, and may be configured to photograph a subject through a part of an active area of the flexible display 230. According to an embodiment, the flash 218 may include, for example, a light-emitting diode or a xenon lamp.

According to various embodiments, the partial camera module 205 of the camera modules 205 and 216, the partial sensor module 204 of the sensor modules 204 and 217, or the indicator may be disposed to be exposed through the flexible display 230. For example, the partial camera module 205, the partial sensor module 204, or the indicator may be disposed to come in contact with an external environment through an opening perforated on the flexible display 230 or a permeable area in the inner space of the electronic device 200. According to an embodiment, the area of the flexible display 230 that faces the partial camera module 205 may be a part of the area for displaying content, and may be formed as a permeable area having a designated permeability. According to an embodiment, the permeable area may be formed to have permeability in a range of about 5% to 20%. The permeable area may include an area which overlaps an effective area (e.g., viewing angle area) of the partial camera module 205 and through which light for generating an image being imaged by an image sensor. For example, the permeable area of the flexible display 230 may include an area having the pixel density and/or wiring density that are lower than those of the surroundings. For example, the above-described opening may be replaced by the permeable area. For example, the partial camera module 205 may include an under display camera (UDC). As an embodiment, the partial sensor module 204 may be disposed to perform its own function without being visually exposed through the flexible display 230 in the inner space of the electronic device 200.

According to various embodiments, the electronic device 200 may include at least one antenna (e.g., antenna module 290 of FIG. 4) (e.g., antenna structure). According to an embodiment, for example, the at least one antenna (e.g., antenna module 290 of FIG. 4) may be configured to transmit and receive signals for wireless communication to and from an external electronic device (e.g., electronic device 104 of FIG. 1). According to an embodiment, the electronic device 200 may include another antenna (not illustrated) disposed in the inner space of the electronic device 200. According to an embodiment, the antenna may wirelessly transmit and receive a power for charging. According to an embodiment, the at least one antenna and/or the another antenna may include a legacy antenna, a mmWave antenna, a near field communication (NFC) antenna, a wireless charging antenna, and/or a magnetic secure transmission (MST) antenna.

According to various embodiments, the electronic device 200 may include an antenna configured to transmit and/or receive a wireless signal through a conductive part 2511 disposed in at least a partial area of the slide structure 250. For example, the slide structure 250 may include a side member 251 formed of a conductive material. According to an embodiment, the side member 251 may include the conductive part 2511 segmented through at least one non-conductive part 2512 and 2513 (e.g., polymer). According to an embodiment, the conductive part 2511 may be electrically connected to a wireless communication circuit (e.g., wireless communication module 192 of FIG. 1) of the electronic device 200.

According to the electronic device 200 according to various embodiments of the disclosure, since at least one electronic component, such as an antenna, a key button module, or a sensor module, is disposed in the slide structure 250, and an electrical connection structure to meet the electronic component is provided, it is advantageous for the layout design of the electronic components, it can manifest an excellent performance regardless of the slide-in/slide-out operation of the slide structure, and it can help the reliability improvement of the electronic device.

FIG. 4 is an exploded perspective view of an electronic device according to various embodiments.

Referring to FIG. 4, an electronic device 200 may include a base bracket 240 including at least one guide roller 241 rotatably disposed, a slide structure 250 slidably combined with the base bracket 240 in a designated reciprocating distance, a bendable member 260 disposed to move together with the slide structure 250, a flexible display 230 disposed to be supported by the slide structure 250 and the bendable member 260, a cover member 221 (e.g., rear cover) fixed to at least a part of the base bracket 240, and at least one side cover 211 and 212 surrounding at least a part of a first space (e.g., first space 2403 of FIG. 5) between the base bracket 240 and the cover member 221. According to an embodiment, the electronic device 200 may configure a housing structure (e.g., housing 210 of FIG. 2A) including the first space (e.g., first space 2403 of FIG. 5) through the base bracket 240, the cover member 221, and the at least one side cover 211 and 212. According to an embodiment, the electronic device 200 may include various electrical structures, such as a first substrate 271 disposed in the first space (e.g., first space 2403 of FIG. 5).

According to various embodiments, the slide structure 250 may be formed in a plate shape at least partly, and may include a first surface 2501 directed in a first direction (e.g., z-axis direction) and a second surface 2502 directed in a second direction (e.g., −z-axis direction) that is opposite to the first direction. According to an embodiment, at least a part of the first surface 2501 of the slide structure 250 may be formed in a shape for supporting the flexible display 230. According to an embodiment, the bendable member 260 (e.g., multi-bar assembly) may be combined to interlock with the slide structure 250. According to an embodiment, when the electronic device 200 is in a slide-in state, the bendable member 260 may slide into the first space (e.g., first space 2403 of FIG. 5) together with a part of the flexible display 230, and may guide so that the flexible display 230 has a first display area. According to an embodiment, when the electronic device 200 is in a slide-out state, the bendable member 260 may form the same plane with the slide structure 250, and may guide so that a part of the flexible display 230 can be seen from an outside. In this case, the flexible display 230 may have a second display area that is larger than the first display area.

According to various embodiments, the slide structure 250 may include a second space (e.g., second space 2503 of FIG. 5) that is formed through a structural change of the first surface 2501 facing the flexible display 230. In an embodiment, the second space (e.g., second space 2503 of FIG. 5) may be formed through a structural change of the second surface 2502 between the slide structure 250 and the base bracket 240. According to an embodiment, the electronic device 200 may include at least one electronic component 204, 205, and 290 disposed in the second space (e.g., second space 2503 of FIG. 5) formed in the slide structure 250. According to an embodiment, the at least one electronic component may include a camera module 205, a sensor module 204, an antenna module 290, or a key button module (not illustrated). According to an embodiment, if the at least one electronic component includes the camera module 205 and/or the sensor module 204, it may be disposed to detect an external environment through the flexible display 230. According to an embodiment, if the at least one electronic component includes the antenna module 290 including a dielectric substrate 291 and an antenna radiator 292 disposed on the dielectric substrate 291, it may be disposed to transmit and receive radio waves in a direction directed by a side member 251 (e.g., x-axis direction and/or direction between the x-axis and z-axis), in a direction directed by the cover member 221 (e.g., −z-axis direction), and/or in a direction directed by the side covers 211 and 212 (e.g., y-axis direction and/or −y-axis direction) in the second space (e.g., second space 2503 of FIG. 5). In an embodiment, the at least one electronic component (e.g., key button module) may be disposed in the second space (e.g., second space 2503 of FIG. 5), and may be exposed through the side member 251 of the slide structure 250. According to an embodiment, the slide structure 250 may include a support cover 2212 disposed to cover the second space (e.g., 2503 of FIG. 5) in order to form a flat surface for supporting the flexible display 230. In this case, the support cover 2212 may include at least one through hole 2212a and 2212b formed in a corresponding location so that the at least one electronic component (e.g., camera module 205 and/or sensor module 204) and the flexible display 230 face each other.

According to various embodiments, the base bracket 240 may include a third surface 2401 facing the slide structure 250 and a fourth surface 2402 directed in an opposite direction to the third surface 2401 and facing the cover member 221. According to an embodiment, the base bracket 240 and/or the side covers 211 and 212 may include a guide structure (not illustrated) for slidably accommodating the slide structure 250 in a designated reciprocating distance. According to an embodiment, at least one guide roller 241 rotatably disposed on the base bracket 240 may support the slide structure 250 in a manner that it winds at least a part of the bendable member 260 connected to the slide structure 250. According to an embodiment, the electronic device 200 may include at least one tension belt 2411 being supported by the guide roller 241 or being disposed near the guide roller 241, and supporting the bendable member 260 so that the bendable member 260 do not droop.

According to various embodiments, the electronic device 200 may include at least one support bracket 2211 (e.g., rear case) disposed between the base bracket 240 and the cover member 221, and providing stiffness to the electronic device 200 or providing a mounting space of the components. In this case, the first substrate 271 (e.g., printed circuit board (PCB)) may be disposed in a space between the base bracket 240 and the support bracket 2211.

According to various embodiments, the electronic device 200 may include an electrical connection structure for electrically connecting the flexible display 230 and the first substrate 271 to each other. According to an embodiment, the electrical connection structure may include a bendable slide FPCB 280 electrically connecting a second substrate (e.g., second substrate 2323 of FIG. 6) (e.g., FPCB) disposed to be folded toward the rear surface of the flexible display 230 and the first substrate 271. According to an embodiment, the slide FPCB 280 may be disposed to penetrate a first opening 2504 formed on the slide structure 250 and a second opening 2404 formed on the base bracket 240. For example, the slide FPCB 280 may include a connection part 281 having a shape and a length for accommodating a slidable reciprocating distance (reciprocating stroke) of the slide structure 250. One end 2811 of the connection part 281 may be electrically connected to the second substrate (e.g., second substrate 2323 of FIG. 6) of the flexible display 230 after penetrating the first opening 2504 of the slide structure 250, and the other end 2812 of the connection part 281 may be electrically connected to the first substrate 271 after penetrating the second opening 2404 of the base bracket 240. According to an embodiment, the slide FPCB and the flexible display, and/or the slide FPCB and the first substrate may be electrically connected to each other through a connector combination structure (e.g., combination structure of a receptacle and a connector).

According to an example embodiment of the disclosure, the electronic device 200 may include at least one electrical connection member (e.g., conductor) for electrically connecting the at least one electronic component disposed in the second space (e.g., second space 2503 of FIG. 5) of the slide structure 250 and the first substrate 271 to each other. According to an embodiment, the at least one electrical connection member may use at least a part of the slide FPCB 280 electrically connecting the flexible display 230 and the first substrate 271 to each other, may use the second substrate 2323, or may be individually disposed. For example, the at least one electrical connection member may be determined in various ways to be described later depending on the location in which the at least one electronic component is disposed in the second space (e.g., second space 2503 of FIG. 5) and the function of the electronic component.

Figure 5:
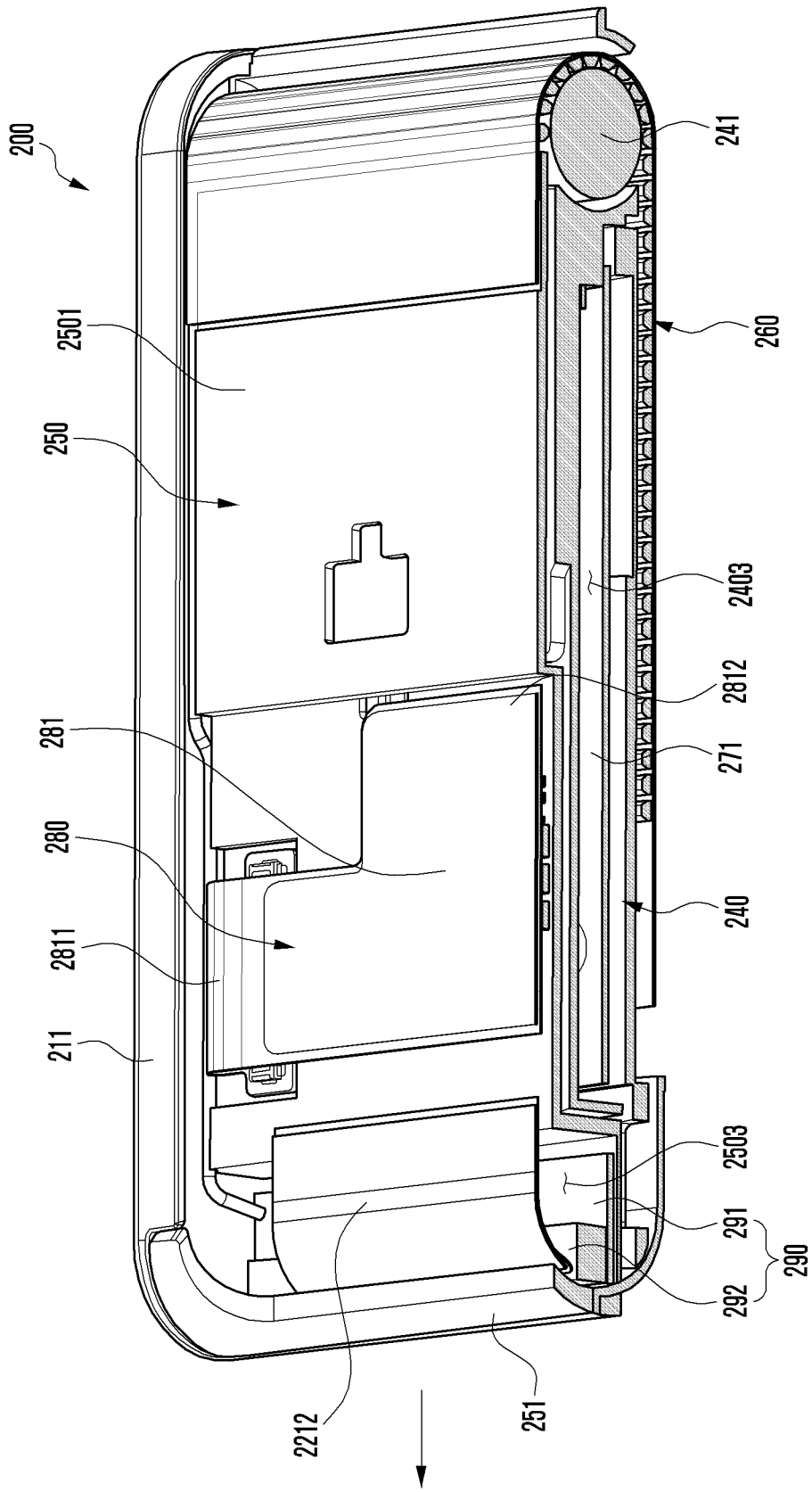
FIG. 5 is a partial perspective view of an electronic device illustrating a layout structure of a slide FPCB according to various embodiments.

FIG. 5 is a partial perspective view of an electronic device illustrating a layout structure of a slide FPCB according to various embodiments.

FIG. 5 is a partial perspective view as seen from a front surface of an electronic device 200, and in order to explain an internal structure, the electronic device 200 is illustrated with a flexible display 230 omitted.

Referring to FIG. 5, an electronic device 200 may include a base bracket 240 including at least one guide roller 241 rotatably disposed, a slide structure 250 slidably combined with the base bracket 240 in a designated reciprocating distance, a bendable member 260 disposed to move together with the slide structure 250, a flexible display 230 disposed to be supported by the slide structure 250 and the bendable member 260, a cover member 221 (e.g., rear cover) fixed to at least a part of the base bracket 240, and at least one side cover 211 surrounding at least a part of a first space (e.g., first space 2403 of FIG. 5) between the base bracket 240 and the cover member 221.

According to various embodiments, the slide structure 250 and the bendable member 260 may be slidably combined with the base bracket 240. According to an embodiment, the electronic device 200 may include a first space 2403 formed between the base bracket 240 and the cover member 221. According to an embodiment, the electronic device 200 may include a second space 2503 that is formed through a structural shape change of the first surface 2501 of the slide structure 250 supporting the flexible display 230. According to an embodiment, the slide structure 250 may include a support cover 2212 forming the same plane as the first surface 2501 and disposed to seal up at least a part of the second space 2503. According to an embodiment, the electronic device 200 may include an antenna module 290 disposed in the second space 2503 formed through the slide structure 250 and the support cover 2212. According to an embodiment, the antenna module 290 may include a dielectric substrate 291 disposed in the second space 2503 and an antenna radiator 292 disposed on the dielectric substrate 291. In an embodiment, the antenna module 290 may be replaced by at least a part (e.g., conductive part 2511 of FIG. 2A) of the conductive side member 251 of the slide structure 250. According to an embodiment, the antenna module 290 may include at least one conductive structure disposed on the dielectric substrate 291, a conductive pattern and/or a conductive patch. According to an embodiment, the antenna module 290 may operate in at least one frequency band among a legacy band operating in the range of 800 MHz to 3300 MHz, a sub-6 band operating in the range of 3.3 GHz to 6 GHz, or a 5G band (new radio (NR)) operating in the range of 3 GHz to 300 GHz.

According to various embodiments, the slide FPCB 280 may be electrically connected to the flexible display 230 through one end 2811 of a connection part 281 that penetrates the slide structure 250, and may be electrically connected to the first substrate 271 through the other end 2812 of the connection part 281 that penetrates the base bracket 240. For example, the connection part 281 of the slide FPCB 280 may be formed in a bendable shape that can accommodate a sliding reciprocating distance of the slide structure 250.

According to example embodiments of the disclosure, the antenna module 290 may be electrically connected to the first substrate 271 through at least one electrical connection member. According to an embodiment, the at least one electrical connection member may use at least a part of the slide FPCB 280 electrically connecting the flexible display 230 and the first substrate 271 to each other, may use the second substrate (e.g., second substrate 2323 of FIG. 6), or may be individually disposed. For example, the at least one electrical connection member may be determined in various ways depending on the location in which the antenna module 290 is disposed in the second space 2503.

Figure 6:
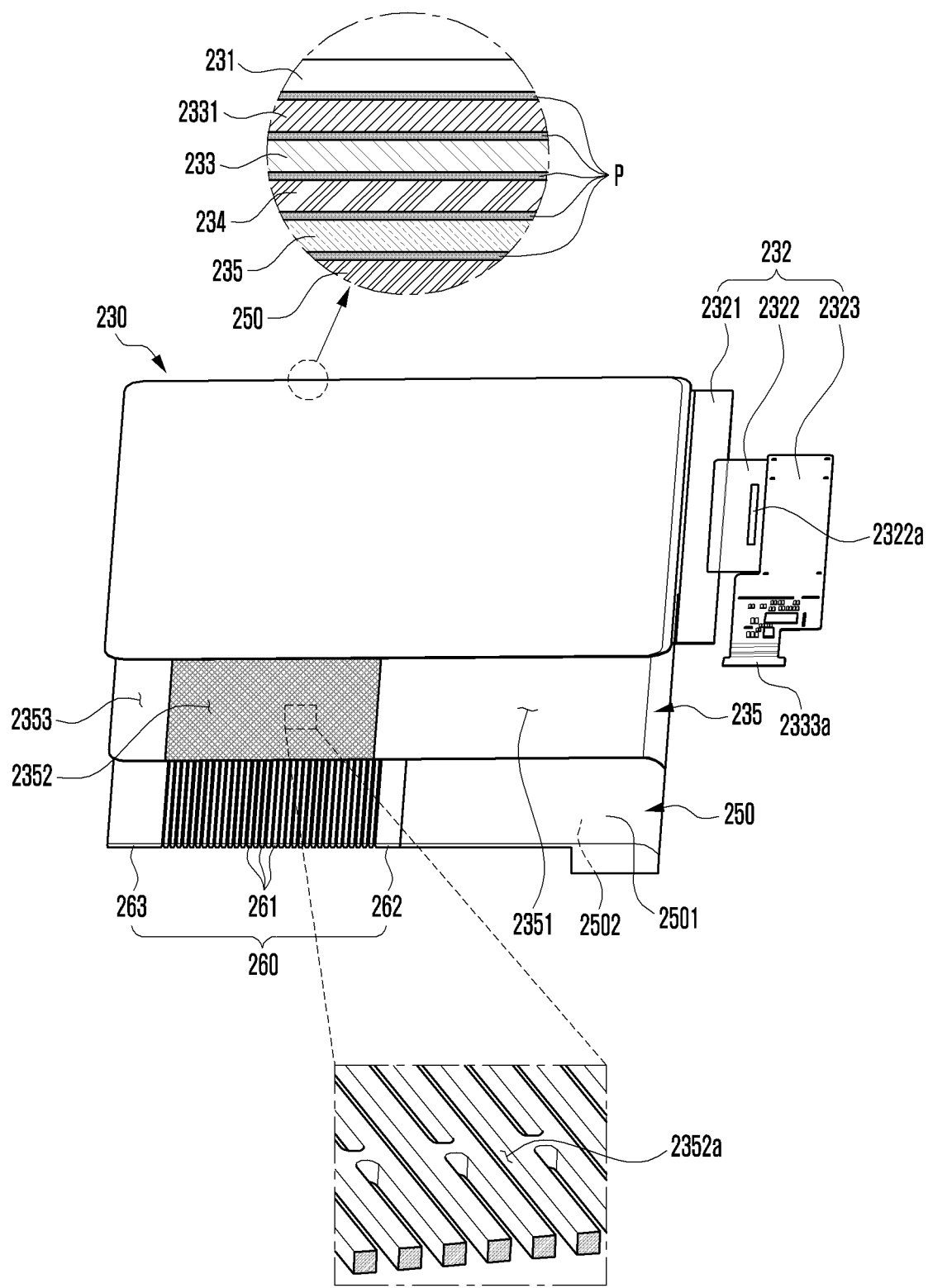
FIG. 6 is a diagram illustrating an example configuration of a flexible display according to various embodiments.

FIG. 6 is a diagram illustrating an example configuration of a flexible display according to various embodiments.

Referring to FIG. 6, the flexible display 230 may include a window layer 231, a polarizer (POL) 2331 (e.g., polarizing film) sequentially disposed on the rear surface of the window layer 231, a display panel 233, a polymer member 234, and a metal sheet layer 235. According to an embodiment, the window layer 231 may include a polymer layer and a glass layer merged with the polymer layer. According to an embodiment, the window layer 231 may include polyethylene terephthalate (PET) and polyimide (PI) as the polymer layer, and may include ultra-thin glass (UTG) as the glass layer.

According to various embodiments, the window layer 231, the polarizer 2331, the display panel 233, the polymer member 234, and the metal sheet layer 235 may be attached to one another through am adhesive P. For example, the adhesive P may include at least one of an optical clear adhesive (OCA), a pressure sensitive adhesive (PSA), a thermal adhesive, a general adhesive, or a double-sided tape. According to an embodiment, the flexible display 230 may be attached to the first surface (e.g., first surface 2501 of FIG. 5) of the slide structure 250 through another adhesive member. In an embodiment, the polarizer 2331 may be replaced by a color filter and a black matrix (BM).

According to various embodiments, the polymer member 234 may have a dark color (e.g., black) applied thereto, and may help the background vision when the display is turned off. According to an embodiment, the polymer member 234 may act as a cushion for preventing and/or reducing the flexible display 230 from being damaged through absorption of an external impact applied to the electronic device 200. In an embodiment, the polymer member 234 may be disposed under the metal sheet layer 235.

According to various embodiments, the metal sheet layer 235 may be used to help the stiffness reinforcement of the electronic device 200, to shield the surrounding noise, to dissipate heat emitted from the surrounding heat emission components, and to provide flexibility to the flexible display. According to an embodiment, the metal sheet layer 235 may include at least one of steel use stainless (SUS) (e.g., stainless steel (STS)), Cu, Al, or CLAD (e.g., laminated member in which SUS and Al are alternately disposed). As an embodiment, the metal sheet layer 235 may include other alloy materials. According to an embodiment, the metal sheet layer 235 may include a first flat part 2351 facing the first surface 2501 of the slide structure 250, a bendable part 2352 connected to the first flat part 2351 and bendably formed, and a second flat part 2353 extending from the bendable part 2352. According to an embodiment, the bendable part 2352 may include a plurality of openings 2352a formed with designated intervals and sizes. In an embodiment, the plurality of openings 2352a may be replaced by a plurality of slits and/or a plurality of recesses. According to an embodiment, the flexibility of the bendable part 2352 may be determined through the shape or layout structure of the plurality of openings 2352a. As an embodiment, the flexible display 230 may further include a detection member (not illustrated) for detecting an input by an electromagnetic induction type writing member. According to an embodiment, the detection member may include a digitizer. As an embodiment, the detection member may be disposed between the display panel 233 and the at least one polymer member 234. As an embodiment, the detection member may be disposed under the metal sheet layer 235, and the metal sheet layer 235 may have a structural shape (e.g., plural openings) detectable by the detection member. As an embodiment, the detection member may be disposed between the metal sheet layer 235 and the slide structure 250.

According to various embodiments, the flexible display 230 may include at least one functional member (not illustrated) disposed between the polymer member 234 and the metal sheet layer 235. According to an embodiment, the functional member may include a graphite sheet for heat dissipation, a force touch FPCB, a fingerprint sensor FPCB, an antenna radiator for communication, a heat dissipation sheet, a conductive/non-conductive tape, and/or an open cell sponge.

According to various embodiments, the bendable member 260 may include a first part 261 facing the bendable part 2352 under the metal sheet layer 235, a second part 262 extending from the first part 261 and facing a part of the first flat part 2351 of the metal sheet layer 235, and a third part 263 facing the second flat part 2353 of the metal sheet layer 235. In an embodiment, the second flat part 2353 and the third part 263 may be omitted. According to an embodiment, the bendable part 2352 may be attached to the first part 261 of the bendable member. According to an embodiment, the first flat part 2351 may be attached to the second part 262 and the first surface 2501 of the slide structure 250. According to an embodiment, the second flat part 2353 may be attached to the third part 263 of the bendable member 260. According to an embodiment, the bendable part 2352 of the metal sheet layer 235 and the first part 261 of the bendable member 260 are attached to each other through an adhesive member having the adhesive characteristic that provides a slip property in a direction in which the slide structure 250 slides, and thus can flexibly support the flexible display 230 when the first part 261 is wound through the guide roller 241.

According to various embodiments, the flexible display 230 may include a bending part 232 disposed in a manner that it is folded from the display panel 233 to at least a partial area of the rear surface of the flexible display 230. According to an embodiment, the bending part 232 may include an extension part 2321 extending from the display panel 233, a connection pad 2322 electrically connected from the extension part 2321 and including a control circuit 2322*a*, and a second substrate (e.g., flexible printed circuit board (FPCCB)) 2323 electrically connected to the connection pad 2322. According to an embodiment, the second substrate 2323 may include a connector 2333*a* for being connected to the slide FPCB (e.g., slide FPCB 280 of FIG. 5). According to an embodiment, the control circuit 2322*a* may include a display driver IC (DDI) and/or a touch display driver IC (TDDI) mounted on the connection pad 2322 having an electrical wiring structure. According to an embodiment, the connection pad 2322 may include a separate FPCB or film including the control circuit 2322*a* disposed in a chip on film (COF) manner. According to an embodiment, the control circuit 2322*a* may include a chip on panel or chip on plastic (COP) structure directly mounted on the extension part 2321 without the connection pad 2322. According to an embodiment, the flexible display 230 may include a plurality of electrical elements disposed on the second substrate 2323. According to an embodiment, the plurality of electrical elements may include at least one passive element, such as a touch IC, a flash memory for display, a diode for preventing and/or reducing ESD, a pressure sensor, or a decap. According to an embodiment, the bending part 232 extending from the display panel 233 may be disposed in a manner that it comes in contact with the metal sheet layer 235 after being folded through edges thereof.

According to various embodiments, the second substrate 2323 may be electrically connected to the first substrate 271 disposed in the first space 2403 of the electronic device 200 through the slide FPCB (e.g., slide FPCB 280 of FIG. 5). In this case, the second substrate 2323 may be used as an electrical connection means for at least one electrical connection member for connecting the antenna module (e.g., antenna module 290 of FIG. 5) disposed in the second space 2503 of the slide structure 250 to the first substrate (e.g., first substrate 271 of FIG. 5) in the surroundings.

Figure 7A:
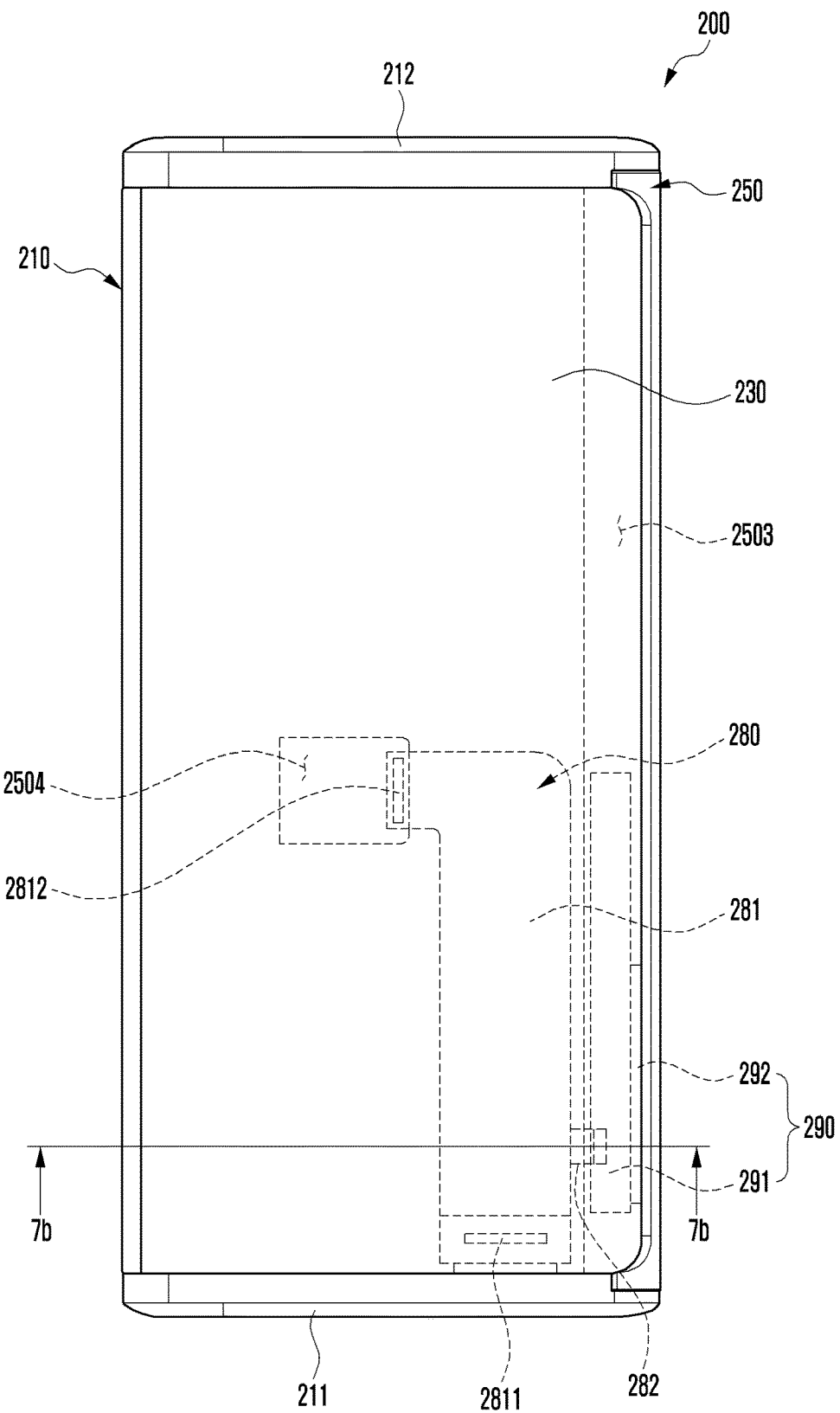
FIG. 7A is a diagram illustrating an example configuration of an electronic device including an electrical connection member according to various embodiments.
Figure 7B:
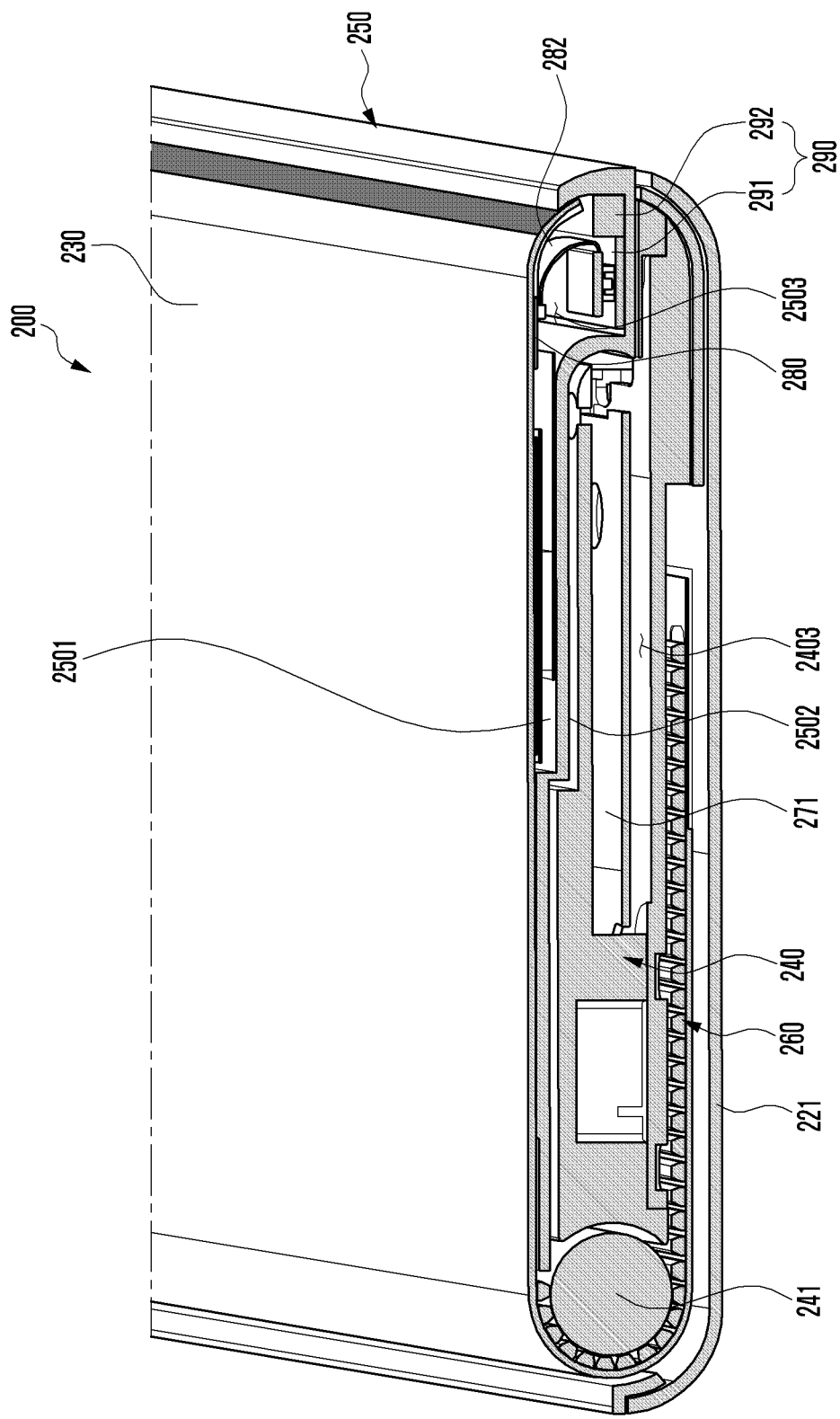
FIG. 7B is a sectional perspective view of an electronic device as seen along line 7b-7b of FIG. 7A according to various embodiments.
Figure 7C:
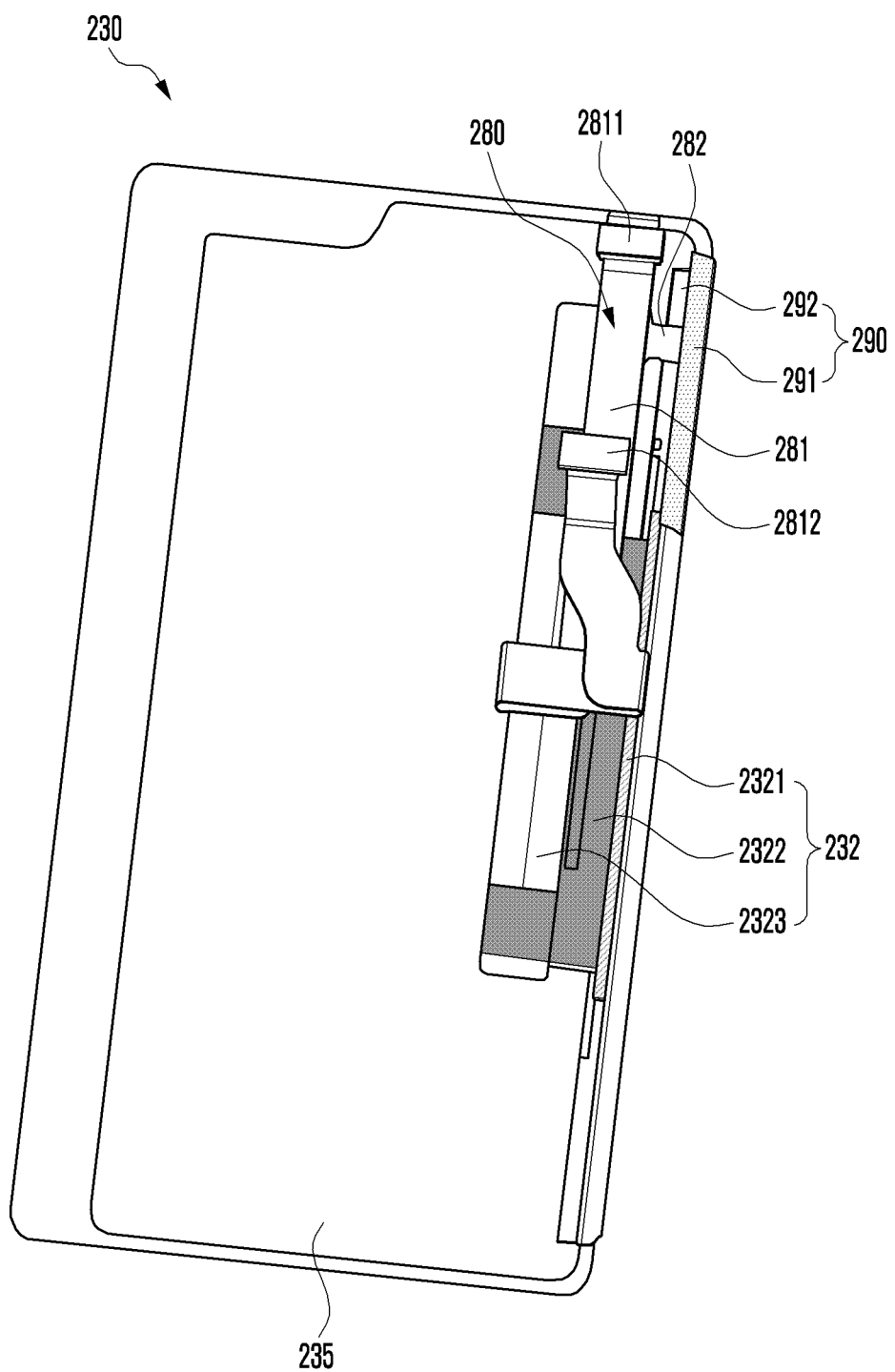
FIG. 7C is a diagram illustrating an electrical connection relationship between an electrical connection member using a slide FPCB and an antenna module on a rear surface of a flexible display according to various embodiments.
Figure 7D:
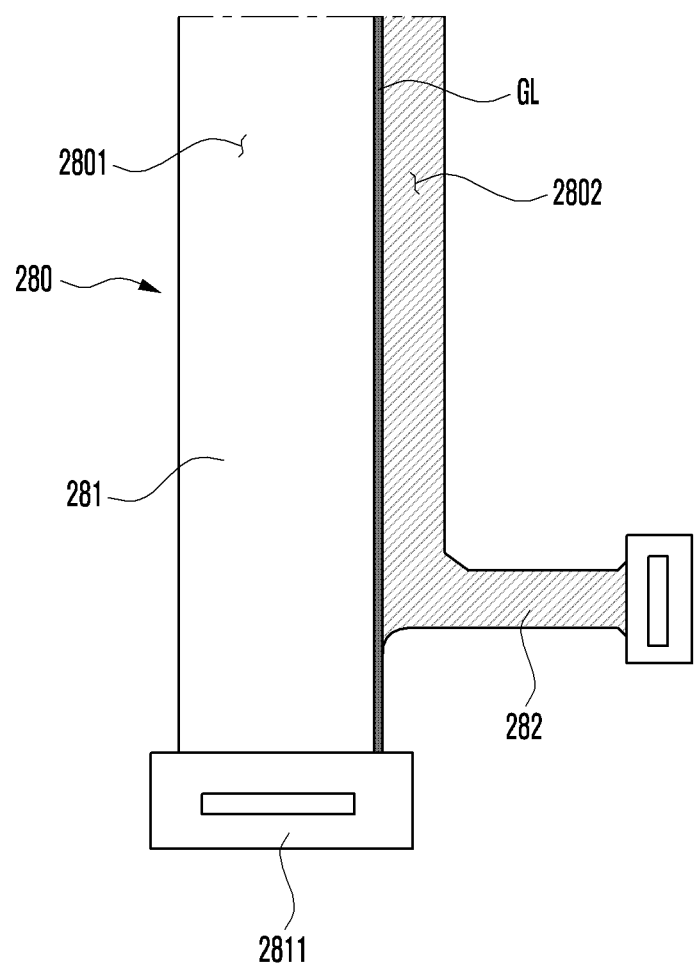
FIG. 7D is a diagram illustrating an example configuration of a slide FPCB according to various embodiments.

FIG. 7A is a diagram illustrating an example configuration of an electronic device including an electrical connection member according to various embodiments. FIG. 7B is a sectional perspective view of an electronic device as seen along line 7*b*-7*b* of FIG. 7A according to various embodiments. FIG. 7C is a diagram illustrating an electrical connection relationship between an electrical connection member using a slide FPCB and an antenna module on a rear surface of a flexible display according to various embodiments. FIG. 7D is a diagram illustrating an example configuration of a slide FPCB according to various embodiments.

In explaining an electronic device of FIGS. 7A, 7B, 7C and 7D, the same reference numerals are given for substantially the same elements as the elements of FIGS. 5 and 6, and the detailed explanation thereof may not be repeated here.

Referring to FIGS. 7A, 7B, 7C and 7D, the electronic device 200 may include a second space 2503 which is formed through at least a part of the slide structure 250 and is formed to face the flexible display 230. According to an embodiment, the electronic device 200 may include an antenna module 290 disposed in the second space 2503. According to an embodiment, the antenna module 290 may include a dielectric substrate 291 disposed in at least a partial area of the second space 2503 and an antenna radiator 292 disposed on the dielectric substrate 291. According to an embodiment, the flexible display 230 may be electrically connected to the first substrate 271 disposed in the first space 2403 through the slide FPCB 280 disposed to penetrate the slide structure 250 and the base bracket 240.

According to various embodiments, the antenna module 290 may be electrically connected to the first substrate 271 through the electrical connection member 282 electrically connecting the slide FPCB 280 and the dielectric substrate 291 of the antenna module 290 to each other. According to an embodiment, the electrical connection member 282 may include an FPCB (e.g., flexible substrate) being branched from at least a part of the slide FPCB 280. In an embodiment, the electrical connection member 282 may include a separate FPCB electrically connecting the slide FPCB 280 and the dielectric substrate 291 to each other. In this case, the antenna module 290 disposed in the second space 2503 may be electrically connected to the first substrate 271 disposed in the first space 2403 through a part of a wiring structure (e.g., RF signal line) provided in the electrical connection member 282 and the slide FPCB 280.

According to various embodiments, the slide FPCB 280 may include a first signal transfer area 2801 and a second signal transfer area 2802 electrically separated from the first signal transfer area 2801. According to an embodiment, the first signal transfer area 2801 may be an area for transferring a control signal of the flexible display 230, and the second signal transfer area 2802 may be an RF signal transfer area for the antenna module 290, and the two areas 2801 and 2802 are shielded from each other, being interposed by a ground line (GL) or a ground layer, to help reduction of a signal transmission loss between them. According to an embodiment, the width and/or the thickness of the ground line GL may be determined in accordance with the arrangement location and/or the signal characteristic (e.g., impedance characteristic) of the at least one signal line disposed in the first signal transfer area 2801 and/or the second signal transfer area 2802. In an embodiment, the second signal transfer area 2802 may be used for signal transfer for at least one other electronic component (e.g., camera module, sensor module, and/or key button module).

Figure 8A:
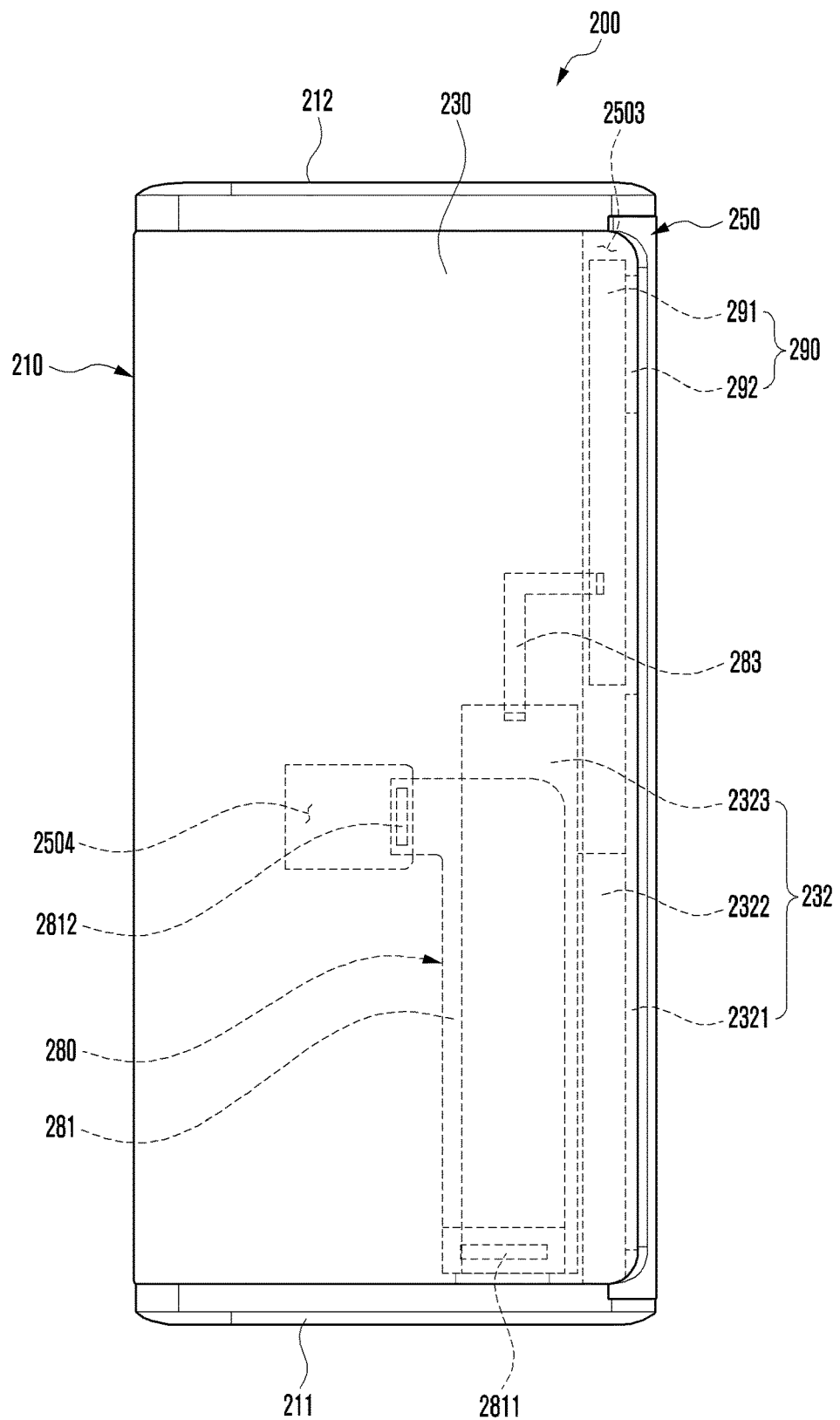
FIG. 8A is a diagram illustrating an example configuration of an electronic device including an electrical connection member according to various embodiments.
Figure 8B:
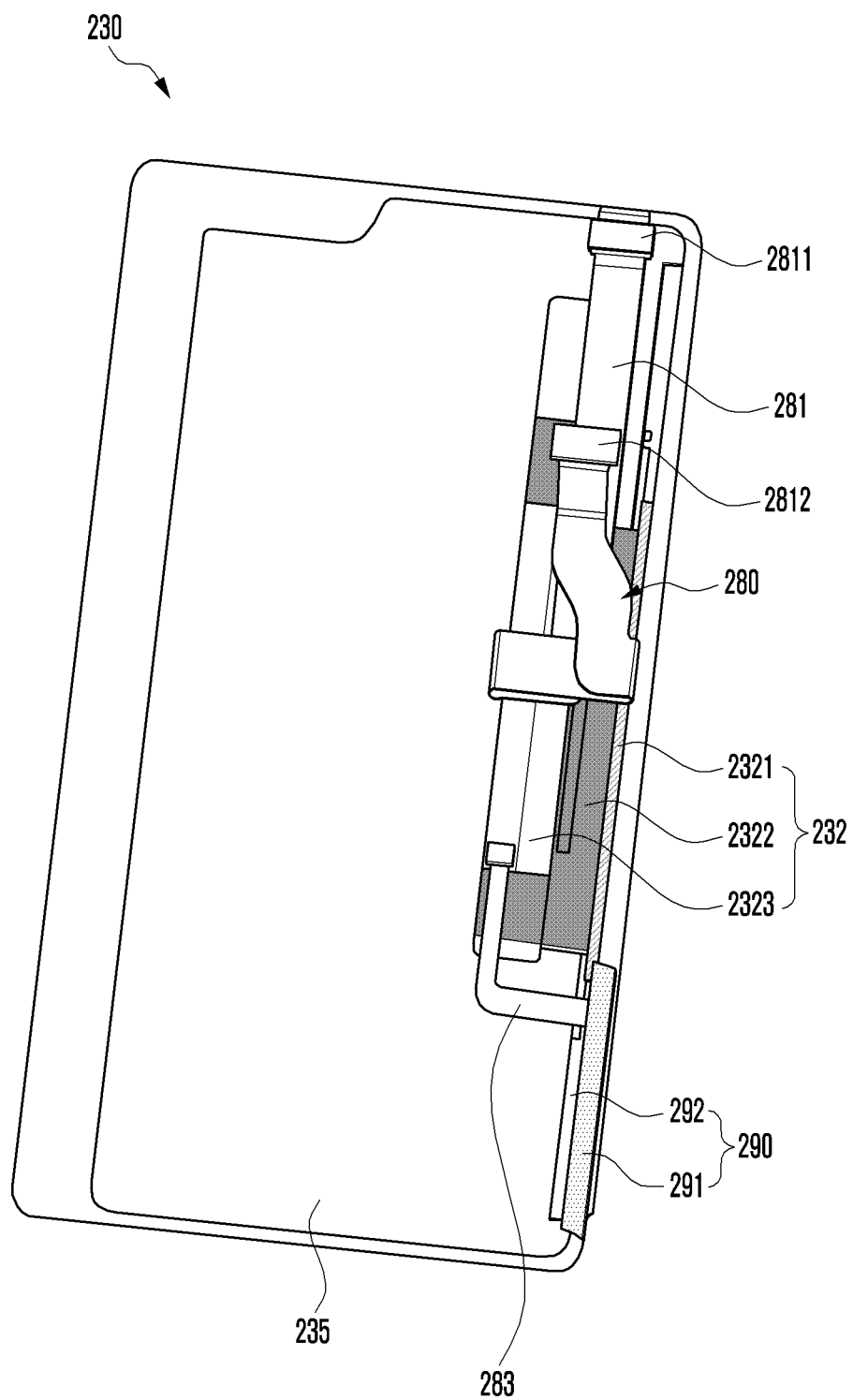
FIG. 8B is a diagram illustrating an electrical connection relationship between an electrical connection member using a second substrate and an antenna module on a rear surface of a flexible display according to various embodiments.
Figure 8C:
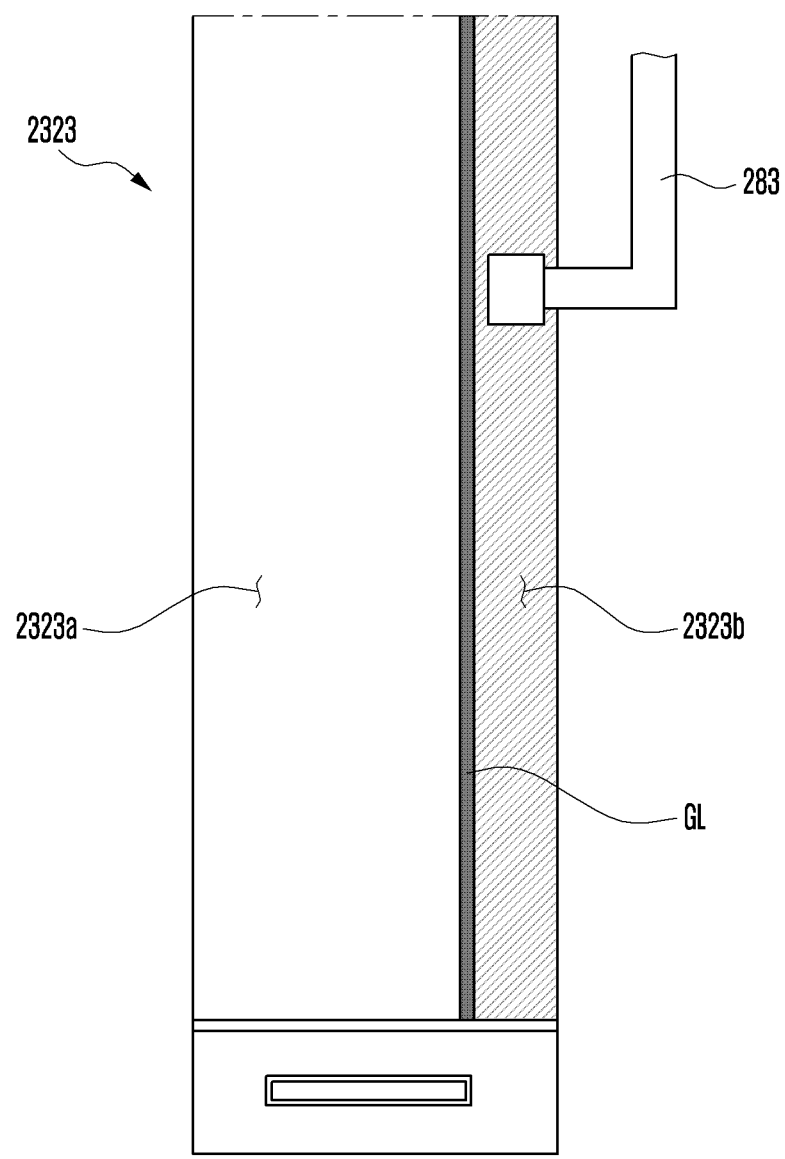
FIG. 8C is a diagram illustrating an example configuration of a second substrate according to various embodiments.

FIG. 8A is a diagram illustrating an example configuration of an electronic device including an electrical connection member according to various embodiments. FIG. 8B is a view illustrating an electrical connection relationship between an electrical connection member using a second substrate and an antenna module on a rear surface of a flexible display according to various embodiments. FIG. 8C is a partial configuration diagram of a second substrate according to various embodiments.

In explaining an electronic device of FIGS. 8A, 8B and 8C, the same reference numerals are given for substantially the same elements as the elements of FIGS. 5 and 6, and the detailed explanation thereof may not be repeated here.

Referring to FIGS. 8A, 8B and 8C, the electronic device 200 may include a second space 2503 which is formed through at least a part of the slide structure 250 and is formed to face the flexible display 230. According to an embodiment, the electronic device 200 may include an antenna module 290 disposed in the second space 2503. According to an embodiment, the antenna module 290 may include a dielectric substrate 291 disposed in at least a partial area of the second space 2503 and an antenna radiator 292 disposed on the dielectric substrate 291. According to an embodiment, the flexible display 230 may be electrically connected to the first substrate 271 disposed in the first space 2403 through the slide FPCB 280 disposed to penetrate the slide structure 250 and the base bracket 240.

According to various embodiments, the antenna module 290 may be electrically connected to the first substrate 271 through the electrical connection member 283 electrically connecting the second substrate 2323 disposed on the bending part 232 extending from the flexible display 230 and the dielectric substrate 291 of the antenna module 290. Such a layout structure may be relatively advantageous in case that the antenna module 290 is disposed in a location in which it is difficult for the antenna module 290 to be connected through a branch structure (e.g., branch structure of FIG. 7A) of the slide FPCB 280 in the second space 2503. According to an embodiment, the electrical connection member 283 may include an FPCB (e.g., flexible substrate) electrically connecting the second substrate 2323 of the bending part 232 and the dielectric substrate 291 of the antenna module 290 to each other. According to an embodiment, the electrical connection member 283 may include an RF coaxial cable electrically connecting a fourth signal transfer area 2323b of the bending part 232 and the dielectric substrate 291 of the antenna module 290 to each other. According to an embodiment, as the electrical connection member 283, the RF coaxial cable may be advantageous in transmitting and receiving an analog signal. In this case, the antenna module 290 disposed in the second space 2503 may be electrically connected to the first substrate 271 disposed in the first space 2403 through the electrical connection member 283, the second substrate 2323 of the bending part 232, and the slide FPCB 280.

According to various embodiments, the second substrate 2323 may include the third signal transfer area 2323a and the fourth signal transfer area 2323b electrically separated from the third signal transfer area 2323a. According to an embodiment, the third signal transfer area 2323a may be an area for transferring a control signal of the flexible display 230, and the fourth signal transfer area 2323b may be an RF signal transfer area for the antenna module 290, and the two areas 2801 and 2802 are shielded from each other, being interposed by the ground line (GL) or the ground layer, to help the reduction of the signal transmission loss between them. According to an embodiment, the third signal transfer area 2323a may be electrically connected to the first signal transfer area 2801 of the slide FPCB 280, and the fourth signal transfer area 2323b may be electrically connected to the second signal transfer area 2802 of the slide FPCB 280.

Figure 9A:
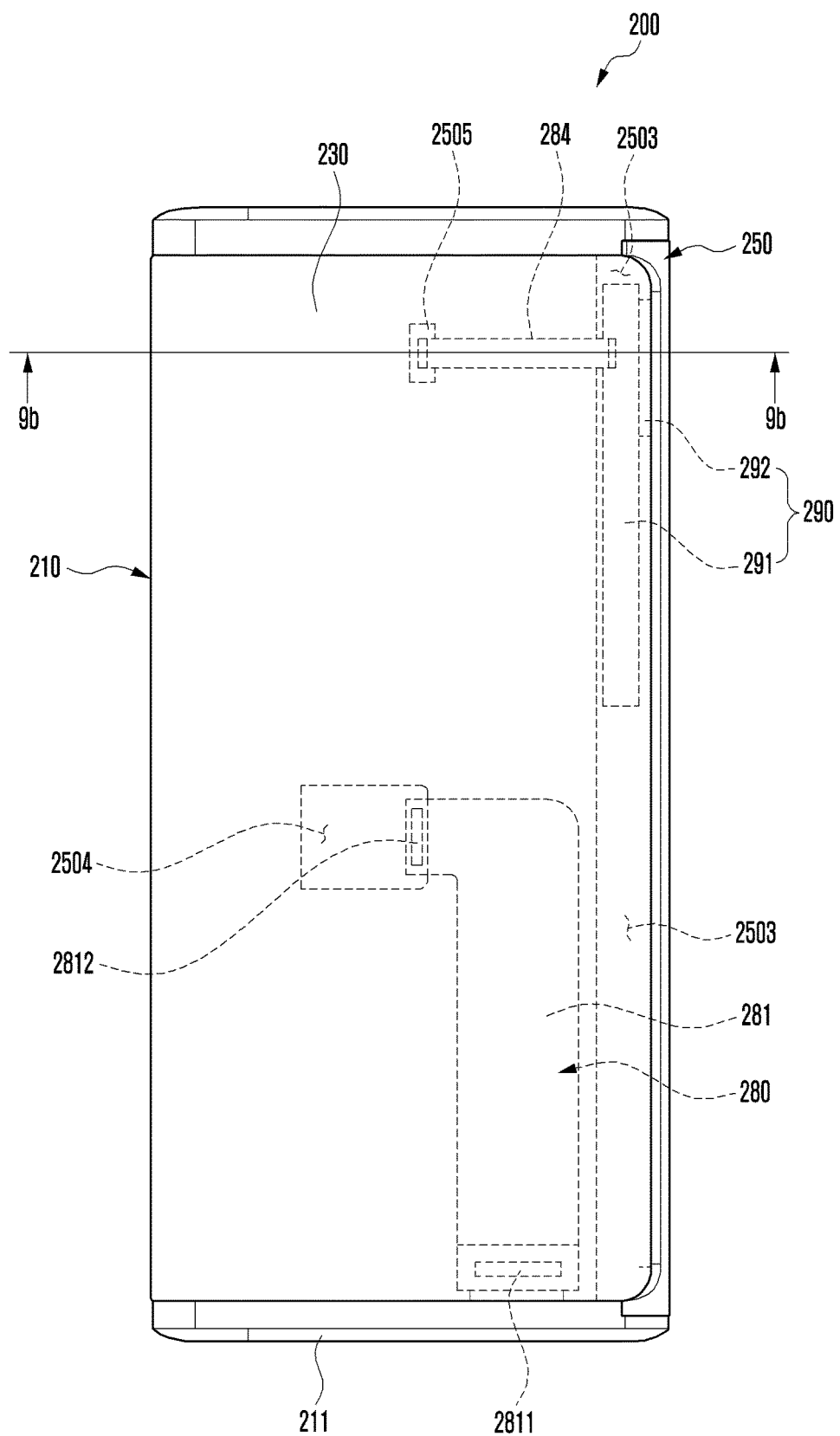
FIG. 9A is a diagram illustrating an example configuration of an electronic device including an electrical connection member according to various embodiments.
Figure 9B:
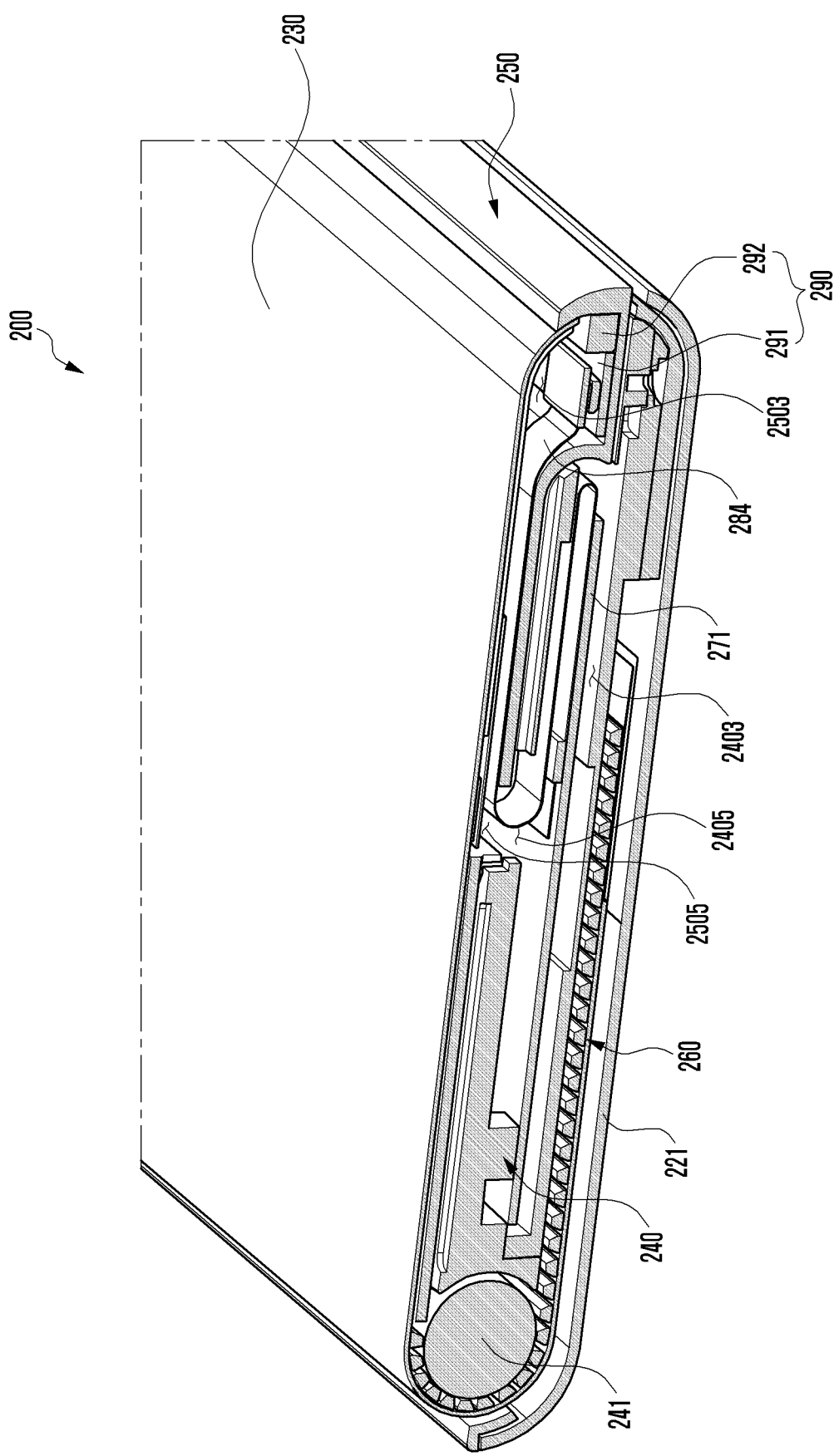
FIG. 9B is a sectional perspective view of an electronic device as seen along line 9b-9b of FIG. 9A according to various embodiments.

FIG. 9A is a diagram illustrating an example configuration of an electronic device including an electrical connection member according to various embodiments. FIG. 9B is a sectional perspective view of an electronic device as seen along line 9b-9b of FIG. 9A according to various embodiments.

In explaining an electronic device of FIGS. 9A and 9B, the same reference numerals are given for substantially the same elements as the elements of FIGS. 5 and 6, and the detailed explanation thereof may not be repeated here.

Referring to FIGS. 9A and 9B, the electronic device 200 may include a second space 2503 which is formed through at least a part of the slide structure 250 and is formed to face the flexible display 230. According to an embodiment, the electronic device 200 may include an antenna module 290 disposed in the second space 2503. According to an embodiment, the antenna module 290 may include a dielectric substrate 291 disposed in at least a partial area of the second space 2503 and an antenna radiator 292 disposed on the dielectric substrate 291. According to an embodiment, the flexible display 230 may be electrically connected to the first substrate 271 disposed in the first space 2403 through the slide FPCB 280 disposed to penetrate the slide structure 250 and the base bracket 240.

According to various embodiments, the antenna module 290 may be electrically connected to the first substrate 271 disposed in the first space 2403 through the electrical connection member 284 disposed in a manner that it penetrates the third opening 2505 disposed on the slide structure and the fourth opening 2405 disposed on the base bracket 240 in a location facing the third opening 2505. According to an embodiment, the electrical connection member 284 may include a bendable FPCB (e.g., flexible substrate) that can accommodate the sliding reciprocating distance of the slide structure. In this case, the antenna module 290 disposed in the second space 2503 may be electrically connected to the first substrate 271 disposed in the first space 2403 through the electrical connection member 284.

Figure 10A:
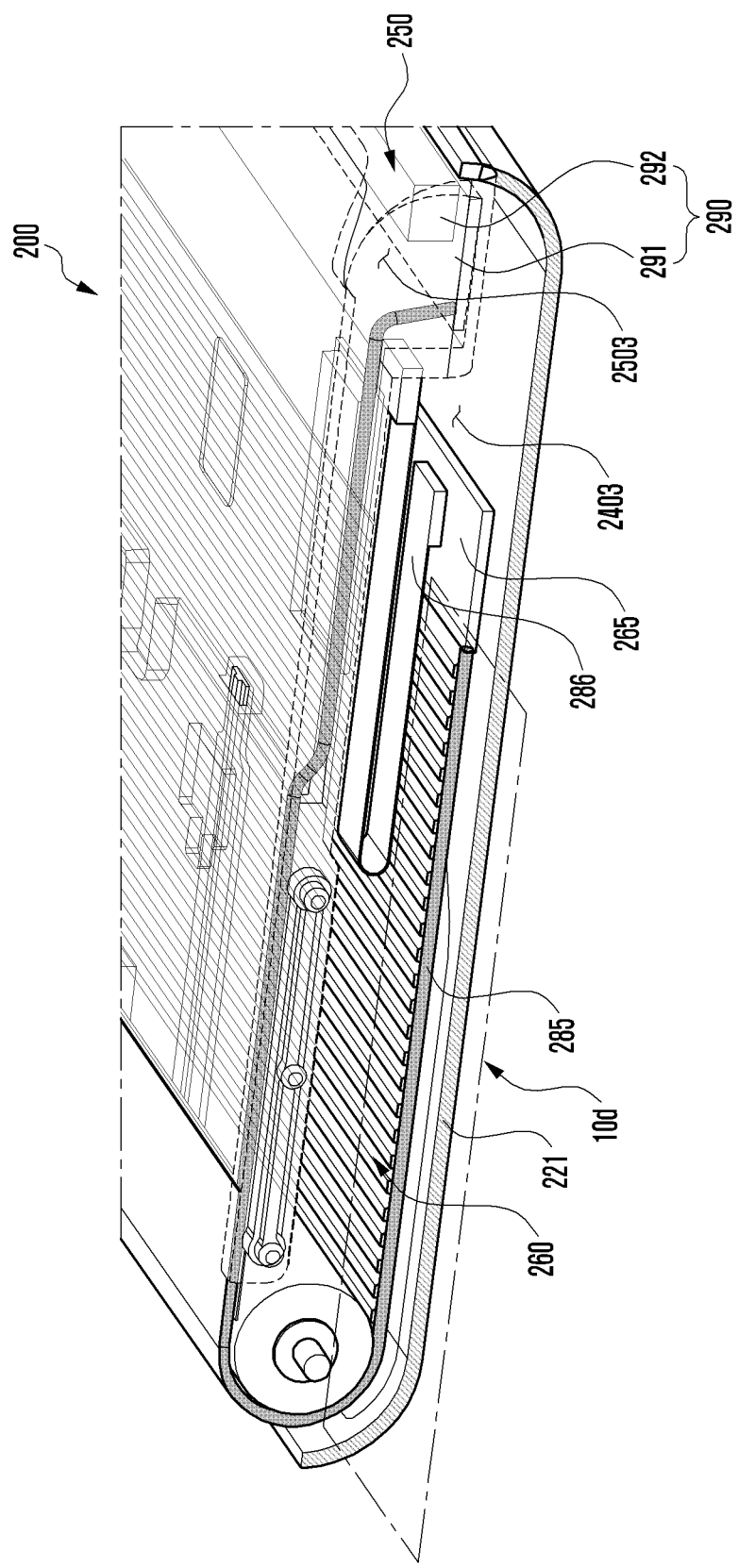
FIGS. 10A and 10B are a sectional perspective view and a side sectional view, respectively, of an electronic device including an electrical connection member according to various embodiments.
Figure 10B:
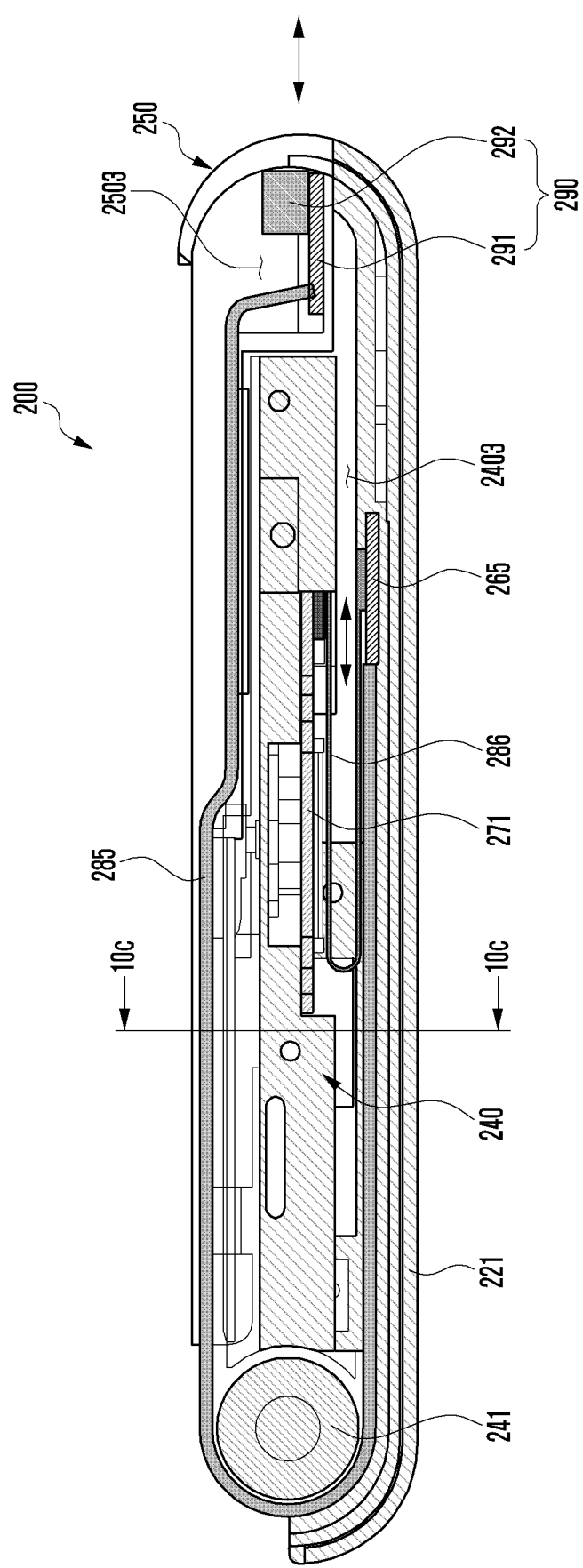
Figure 10C:
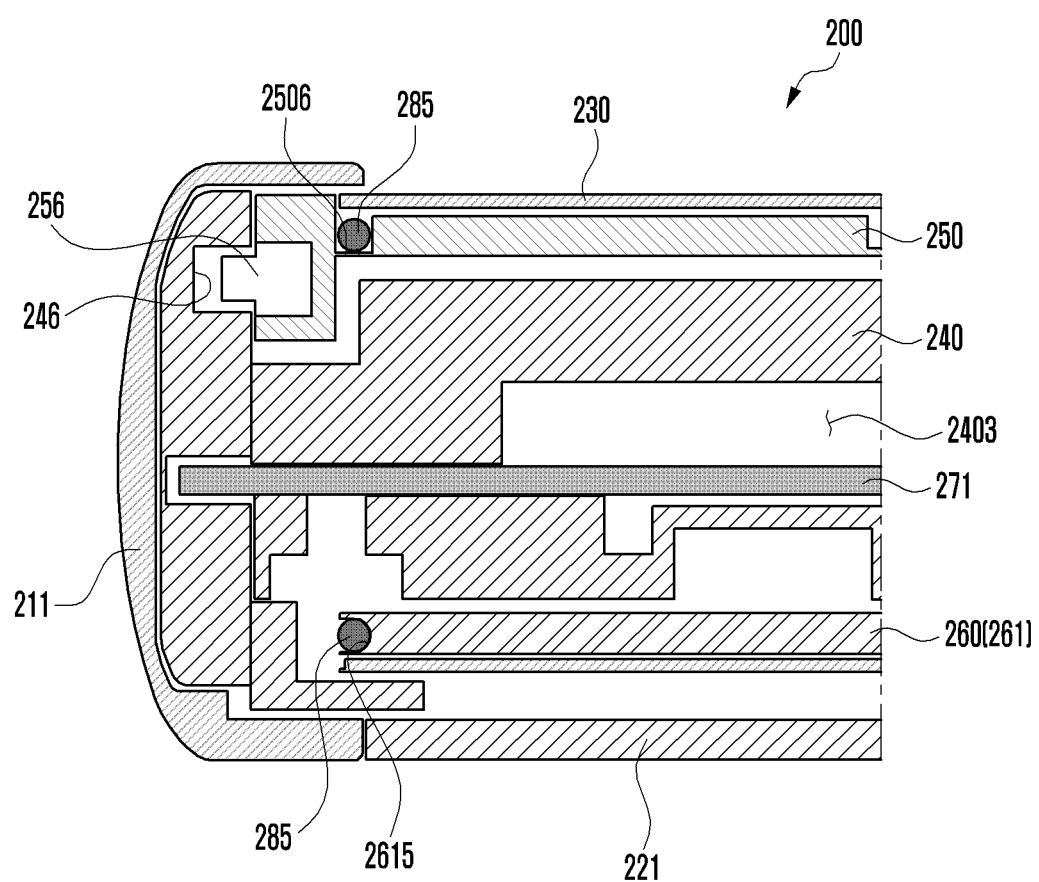
FIG. 10C is a partial sectional view of an electronic device as seen along line 10c-10c of FIG. 10B according to various embodiments.
Figure 10D:
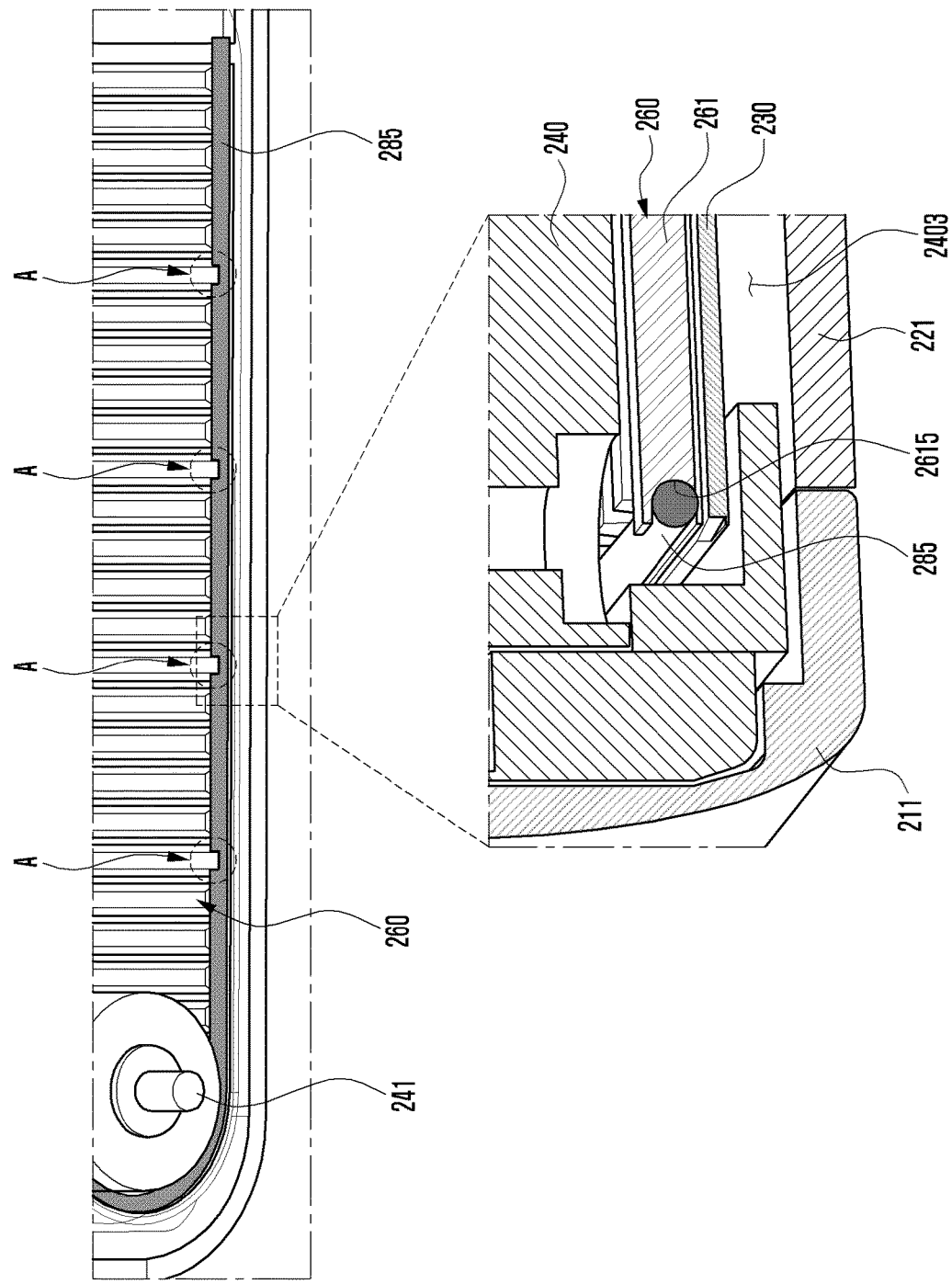
FIG. 10D is an enlarged view of an area 10d of FIG. 10A according to various embodiments.

FIGS. 10A and 10B are a sectional perspective view and a side sectional view, respectively, of an electronic device including an electrical connection member according to various embodiments. FIG. 10C is a partial sectional view of an electronic device as seen along line 10c-10c of FIG. 10B according to various embodiments. FIG. 10D is an enlarged view of an area 10d of FIG. 10A according to various embodiments.

In explaining an electronic device of FIGS. 10A, 10B, 10C and 10D, the same reference numerals are given for substantially the same elements as the elements of FIGS. 5 and 6, and the detailed explanation thereof may not be repeated here.

Referring to FIGS. 10A, 10B, 10C and 10D, the electronic device 200 may include a second space 2503 which is formed through at least a part of the slide structure 250 and is formed to face the flexible display 230. According to an embodiment, the electronic device 200 may include an antenna module 290 disposed in the second space 2503. According to an embodiment, the antenna module 290 may include a dielectric substrate 291 disposed in at least a partial area of the second space 2503 and an antenna radiator 292 disposed on the dielectric substrate 291. According to an embodiment, the antenna module 290 may operate as a single patch antenna, an array type antenna including a plurality of conductive patches disposed to be spaced apart at designated intervals, a monopole antenna, a dipole antenna, a parallel plate waveguide antenna, or a tapered slot antenna. According to an embodiment, the flexible display 230 may be electrically connected to the first substrate 271 disposed in the first space 2403 through the slide FPCB (e.g., slide FPCB 280 of FIG. 5) disposed to penetrate the slide structure 250 and the base bracket 240. According to an embodiment, the slide structure 250 may perform a sliding operation in a manner that a hinge rail 256 disposed on the side surface thereof is guided by a guide slit 246 of the side cover 211.

According to various embodiments, the antenna module 290 may be electrically connected to the first substrate 271 through the electrical connection member 285 fixed to extend from the second space 2503 up to the first space 2403 along one side of the slide structure 250 and the bendable member 260. According to an embodiment, the electrical connection member 285 may be formed of a flexible conductive material disposed to interlock with the sliding operation of the slide structure 250 and the bendable member 260 being supported by a guide roller 241. For example, the electrical connection member 285 may include an RF coaxial cable disposed to interlock with the slide structure 250 and the bendable member 260. According to an embodiment, one end of the electrical connection member 285 may be fixed to the dielectric substrate 291 of the antenna module 290, and the other end thereof may be fixed to the sub-substrate 265 fixed to the other end of the bendable member 260. According to an embodiment, the sub-substrate 265 may be disposed in the first space 2403, and may be electrically connected to the first substrate 271 through the bendable FPCB 286. Accordingly, the antenna module 290 may be electrically connected to the first substrate 271 through the electrical connection member 285, the sub-substrate 265, and the bendable FPCB 286. According to an embodiment, a wireless communication circuit (e.g., wireless communication module 192 of FIG. 1) may be disposed on the sub-substrate 265. In an embodiment, the wireless communication circuit (e.g., wireless communication module 192 of FIG. 1) may be disposed on the dielectric substrate 291.

According to various embodiments, the electrical connection member 285 may be fixed to or supported by the slide structure 250 and the bendable member 260 through the support structure. For example, the electrical connection member 285 may be disposed to be supported by a fixing groove 2506 formed on one side of the slide structure 250. According to an embodiment, the electrical connection member 285 may be fixed through support grooves 2615 disposed at intervals at least partly designated by the bendable member 260. For example, if the bendable member 260 includes a plurality of multi-bars being rotatably combined with one another, the support grooves 2615 are formed only on multi-bars (e.g., multi-bars disposed in area A of FIG. 10D) selected at designated intervals among the plurality of multi-bars, and thus the electrical connection member 285 can help to provide flexibility that interlocks with the bendable member 260. According to an embodiment, as the electrical connection member 285, the RF coaxial cable may be advantageous in transmitting and receiving the analog signal.

Figure 11A:
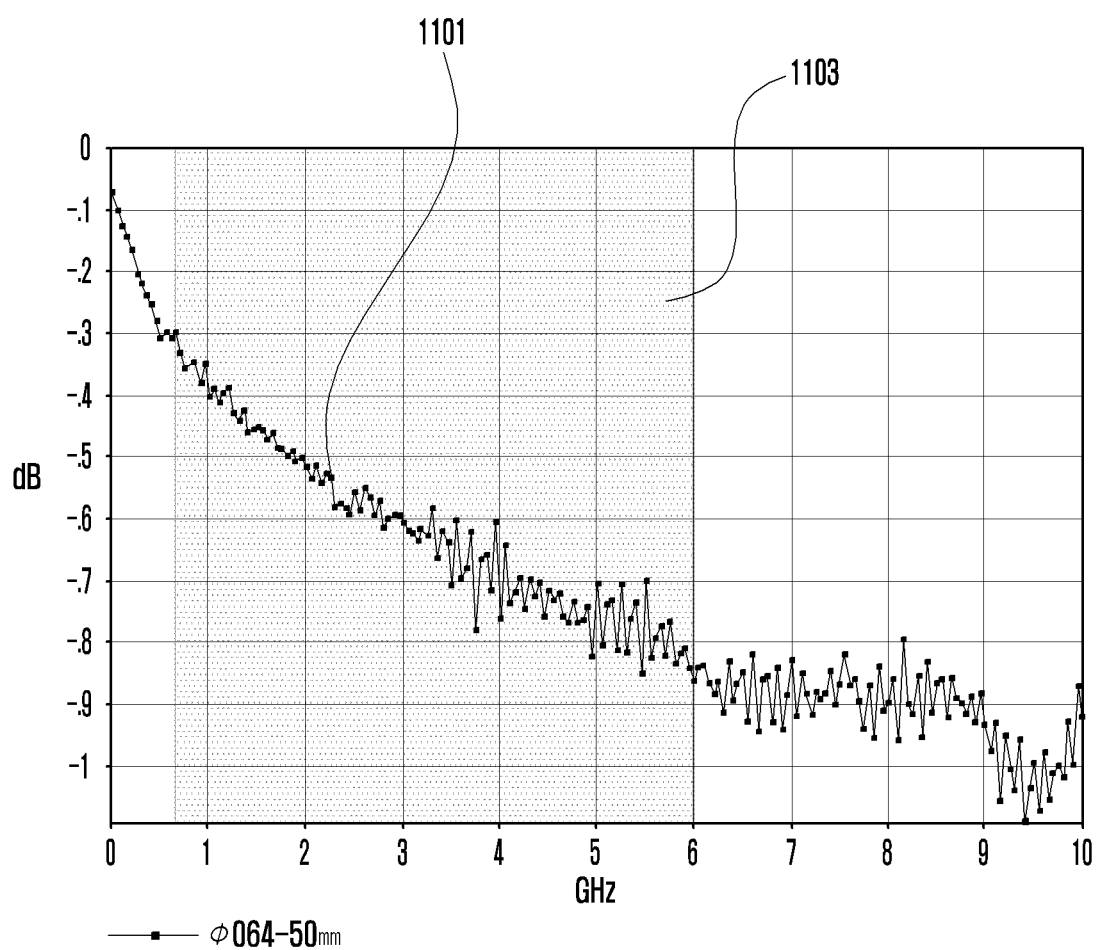
FIGS. 11A and 11B are graphs comparing losses by lengths of an electrical connection member according to various embodiments.
Figure 11B:
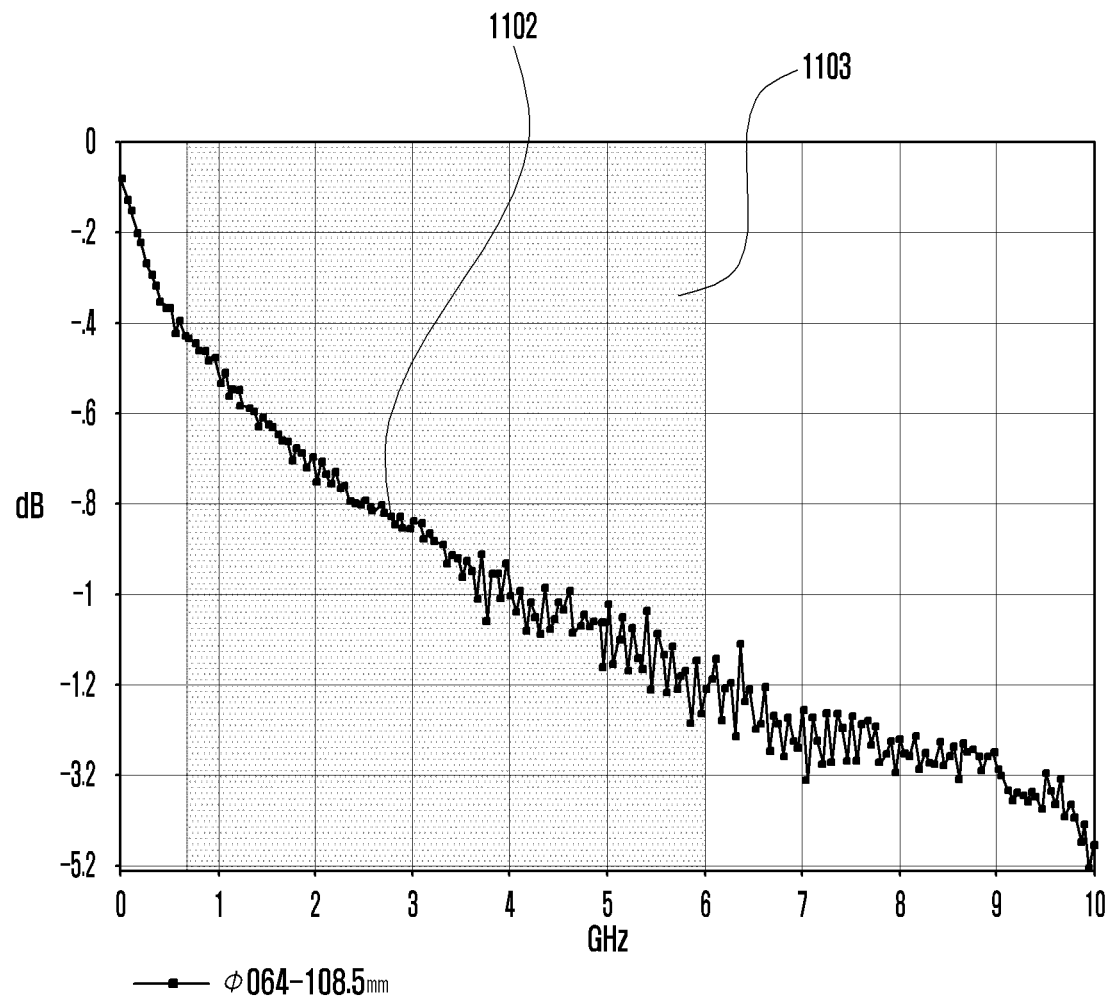

FIGS. 11A and 11B are graphs comparing losses by lengths of an electrical connection member according to various embodiments.

FIG. 11A is a graph (1101) showing a loss of a general RF cable having a first length as the electrical connection member, and FIG. 11B is a graph (1102) showing a loss of an RF cable having a second length that is longer than the first length as the electrical connection member presented in FIG. 10A. In FIG. 11B, it can be known that a difference in signal loss does not occur in an effective frequency band (e.g., 800 MHz to 6000 MHz band) (area 1103).

In example embodiments of the disclosure, although it is individually illustrated and explained that electronic connection members 282, 283, 284, and 285 electrically connect the electronic component (e.g., antenna module) disposed in the slide structure 250 to the first substrate 271 disposed in the base bracket 240, the disclosure is not limited thereto. For example, the same or different signals of the electronic component may be simultaneously transferred through at least two of the electronic connection member 282 of FIG. 7A, electronic connection member 283 of FIG. 8A, electronic connection member 284 of FIG. 9A, or electronic connection member 285 of FIG. 10A. For example, in case that the antenna module 290 is applied as the electronic component, it may be configured to transmit and receive a digital signal through any one of the electronic connection member 282 of FIG. 7A, electronic connection member 283 of FIG. 8A, or electronic connection member 284 of FIG. 9A, which are configured as the flexible substrate (FPCB), and to transmit and receive an analog signal through the electrical connection member 285 of FIG. 10A.

According to various example embodiments, an electronic device may include: a housing (e.g., housing 210 of FIG. 2A) including a first space (e.g., first space 2403 of FIG. 7B); a slide structure (e.g., slide structure 250 of FIG. 7B) including a first surface (e.g., first surface 2501 of FIG. 7B) directed in a first direction (e.g., z-axis direction of FIG. 4) and a second surface (e.g., second surface 2502 of FIG. 7B) directed in a second direction (e.g., −z-axis direction of FIG. 4) opposite the first direction, and slidably combined with the housing; a bendable member (e.g., bendable member 260 of FIG. 7B) connected to the slide structure, and being at least partly accommodated in the first space in a slide-in state and forming a same plane as the slide structure in a slide-out state; a flexible display (e.g., flexible display 230 of FIG. 7B) supported by the bendable member and the slide structure; a first substrate (e.g., first substrate 271 of FIG. 7B) disposed in the first space; at least one electronic component (e.g., antenna module 290 of FIG. 7B) disposed in a second space (e.g., second space 2503 of FIG. 7B) between the first surface of the slide structure and the flexible display; and at least one electrical connection member (e.g., electrical connection member 282 of FIG. 7B) connecting the flexible display to the first substrate.

According to various example embodiments, the flexible display may include a display panel; and a bending portion extending to an outside of the display panel and including a second substrate, wherein at least a part of the bending portion and the second substrate are attached to a rear surface of the display through bending of the bending portion, and the at least one electrical connection member includes a bendable slide FPCB having one end connected to the second substrate and the other end connected to the first substrate.

According to various example embodiments, the slide FBCB may electrically connect the first substrate and the second substrate to each other by at least partly penetrating the slide structure.

According to various example embodiments, the electronic device may include an FPCB branched from at least a part of the slide FPCB and electrically connected to the at least one electronic component.

According to various example embodiments, the slide FPCB may include a first signal transfer area electrically connected to the flexible display and a second signal transfer area electrically connected to the FPCB.

According to various example embodiments, the first signal transfer area and the second signal transfer area may be electrically shielded from each other through a ground area.

According to various example embodiments, the at least one electrical connection member may be electrically connected to the first substrate by at least partly penetrating the slide structure.

According to various example embodiments, the second space may be formed through a change of the slide structure.

According to various example embodiments, the at least one electronic component may be disposed to detect an external environment through at least a part of the flexible display in the second space.

According to various example embodiments, the at least one electronic component may include at least one of an antenna module, a camera module, a sensor module, or a key button module disposed in the second space.

According to various example embodiments, the slide structure may include a conductive side portion disposed near the second space and disposed to be at least partly visible, the conductive side portion may include at least one conductive part disposed through at least one non-conductive part, and the conductive part may be configured to operate as an antenna connected to the at least electrical connection member.

According to various example embodiments, the at least one electrical connection member may include a bendable conductive cable extending from the first space to the second space through a support structure disposed in the slide structure and the bendable member, and the conductive cable may electrically connect the first substrate and the at least one electronic component to each other.

According to various example embodiments, the electronic device may include a sub-substrate disposed at an end part of the bendable member and electrically connected to the conductive cable; and a bendable FPCB disposed in the first space and electrically connecting the sub-substrate and the first substrate to each other.

According to various example embodiments, the at least one electronic component may include an antenna module, and the sub-substrate may include a wireless communication circuit configured to transmit and/or receive a wireless signal through the antenna module.

According to various example embodiments, the conductive cable may include an RF coaxial cable.

According to various example embodiments, the bendable member may include a multi-bar assembly including a plurality of multi-bars rotatably combined with one another, wherein the support structure may include: a fixing groove formed on one side of the slide structure to support at least a part of the conductive cable; and a support groove formed at an end part of one side of some of the plurality of multi-bars of the multi-bar assembly at designated intervals, and supporting the at least a part of the conductive cable.

According to various example embodiments, the conductive cable may be configured to move together with the slide structure and the bendable member.

According to various example embodiments, the housing may include: a base bracket combined with the slide structure; a cover disposed to be spaced apart from the base bracket and providing the first space; and at least one side cover at least partially surrounding the first space.

According to various example embodiments, the electronic component may include an antenna module disposed in the second space, wherein the at least one electrical connection member may include: a bendable FPCB having one end connected to the antenna module and the other end connected to the first substrate; and a bendable conductive cable supported by the slide structure and the bendable member, extending from the first space to the second space, and having one end connected to the first substrate and the other end electrically connected to the antenna module.

According to various example embodiments, the bendable FPCB may be configured to transmit and receive a digital signal, and the bendable conductive cable may be configured to transmit and receive an analog signal.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising: a housing including a first space; a slide structure including a first surface directed in a first direction and a second surface directed in a second direction opposite the first direction, and slidably combined with the housing; a bendable member connected to the slide structure, and at least partly accommodated in the first space in a slide-in state and forming a same plane as the slide structure in a slide-out state; a flexible display supported by the bendable member and the slide structure; a first substrate disposed in the first space; at least one electronic component disposed in a second space between the first surface of the slide structure and the flexible display; and at least one electrical connection member electrically connecting the at least one electronic component and the flexible display to the first substrate, wherein the flexible display comprises: a display panel; and a bending portion extending to an outside of the display panel and including a second substrate, wherein at least a part of the bending portion and the second substrate are disposed to be folded toward a rear surface of the display through bending of the bending portion, and the at least one electrical connection member includes a bendable FPCB having one end connected to the second substrate and the other end connected to the first substrate.

2. The electronic device of claim 1, wherein the bendable FBCB electrically connects the first substrate and the second substrate to each other by at least partly penetrating the slide structure.

3. The electronic device of claim 1, comprising an FPCB branched from at least a part of the bendable FPCB and electrically connected to the at least one electronic component.

4. The electronic device of claim 3, wherein the bendable FPCB comprises a first signal transfer area electrically connected to the flexible display and a second signal transfer area electrically connected to the FPCB.

5. The electronic device of claim 4, wherein the first signal transfer area and the second signal transfer area are electrically shielded from each other through a ground area.

6. The electronic device of claim 1, wherein the at least one electrical connection member is electrically connected to the first substrate by at least partly penetrating the slide structure.

7. The electronic device of claim 1, wherein the second space is formed through a structural change of the slide structure.

8. The electronic device of claim 1, wherein the at least one electronic component is disposed to detect an external environment through at least a part of the flexible display in the second space.

9. The electronic device of claim 1, wherein the at least one electronic component comprises at least one of an antenna module, a camera module, a sensor module, or a key button module disposed in the second space.

10. The electronic device of claim 1, wherein the slide structure comprises a conductive side member disposed near the second space and disposed to be at least partially visible,
the conductive side member includes at least one conductive part disposed through at least one non-conductive part, and
the at least one conductive part is configured to operate as an antenna connected to the at least electrical connection member.

11. The electronic device of claim 1, wherein the at least one electrical connection member comprises a bendable conductive cable extending from the first space to the second space through a support disposed in the slide structure and the bendable member, and the conductive cable electrically connecting the first substrate and the at least one electronic component to each other.

12. The electronic device of claim 11, comprising:
a sub-substrate disposed at an end part of the bendable member and electrically connected to the conductive cable; and
a bendable FPCB disposed in the first space and electrically connecting the sub-substrate and the first substrate to each other.

13. The electronic device of claim 11, wherein the at least one electronic component comprises an antenna module, and the sub-substrate includes a wireless communication circuit configured to transmit and/or receive a wireless signal through the antenna module.

14. The electronic device of claim 11, wherein the conductive cable comprises an RF coaxial cable.

15. The electronic device of claim 11, wherein the bendable member comprises a multi-bar assembly including a plurality of multi-bars rotatably combined with one another, wherein the support includes:

a fixing groove formed on one side of the slide structure and configured to support at least a part of the conductive cable; and
a support groove formed at an end part of one side of some of the plurality of multi-bars of the multi-bar assembly at designated intervals, and configured to support the at least a part of the conductive cable.

16. The electronic device of claim 11, wherein the conductive cable is configured to move together with the slide structure and the bendable member.

17. The electronic device of claim 1, wherein the housing comprises:
a base bracket combined with the slide structure;
a cover spaced apart from the base bracket and providing the first space; and
at least one side cover at least partially surrounding the first space.

18. The electronic device of claim 1, wherein the electronic component comprises an antenna module disposed in the second space, wherein the at least one electrical connection member includes:
a bendable FPCB disposed to have one end connected to the antenna module and the other end connected to the first substrate; and
a bendable conductive cable disposed to be supported by the slide structure and the bendable member, extending from the first space to the second space, and having one end connected to the first substrate and the other end electrically connected to the antenna module.

19. The electronic device of claim 18, wherein the bendable FPCB is configured to transmit and receive a digital signal, and the bendable conductive cable is configured to transmit and receive an analog signal.

* * * * *